United States Patent
Zorzos et al.

(10) Patent No.: US 11,262,420 B2
(45) Date of Patent: Mar. 1, 2022

(54) INTEGRATED GAS CELL AND OPTICAL COMPONENTS FOR ATOMIC MAGNETOMETRY AND METHODS FOR MAKING AND USING

(71) Applicant: HI LLC, Los Angeles, CA (US)

(72) Inventors: Anthony Zorzos, Lexington, MA (US); Jamu Alford, Lake Arrowhead, CA (US); Ricardo Jiménez-Martínez, Culver City, CA (US)

(73) Assignee: HI LLC, Los Angeles, CA (US)

( * ) Notice: Subject to any disclaimer, the term of this patent is extended or adjusted under 35 U.S.C. 154(b) by 0 days.

(21) Appl. No.: 16/418,500

(22) Filed: May 21, 2019

(65) Prior Publication Data

US 2020/0057116 A1    Feb. 20, 2020

Related U.S. Application Data

(60) Provisional application No. 62/741,777, filed on Oct. 5, 2018, provisional application No. 62/719,471, filed on Aug. 17, 2018.

(51) Int. Cl.
*G01R 33/032*    (2006.01)

(52) U.S. Cl.
CPC .................... *G01R 33/032* (2013.01)

(58) Field of Classification Search
CPC ...... G01R 33/26; G01R 33/032; G01R 33/02; G01R 33/025; G01R 33/022; G01R 33/0385; G01N 24/006; B82Y 25/00
See application file for complete search history.

(56) References Cited

U.S. PATENT DOCUMENTS

| | | | |
|---|---|---|---|
| 3,173,082 | A | 3/1965 | Bell et al. |
| 3,257,608 | A | 6/1966 | Bell et al. |
| 3,495,161 | A | 2/1970 | Bell |
| 3,501,689 | A | 3/1970 | Robbiano |

(Continued)

FOREIGN PATENT DOCUMENTS

| | | |
|---|---|---|
| CN | 104730484 | 6/2015 |
| CN | 106073751 | 11/2016 |

(Continued)

OTHER PUBLICATIONS

Scott Jettrey Seltzer: "Developments in alkali-metal atomic magnetometry", Nov. 1, 2008 (Nov. 1, 2008), XP055616618, ISBN: 978-0-549-93355-7 Retrieved from the Internet: URL:http://physics.princeton.edu/atomic/romalis/papers/Seltzer%20Thesis.pdf [retrieved on Aug. 29, 2019] pp. 148-159.

(Continued)

*Primary Examiner* — Jermele M Hollington
*Assistant Examiner* — Suresh K Rajaputra
(74) *Attorney, Agent, or Firm* — Branch Partners PLLC; Bruce E. Black

(57) ABSTRACT

A magnetometer can include a single, integrated, unitary structure that has a gas cell defining a cavity having a vapor or vaporizable material disposed therein, a collimating element coupled to the gas cell and configured for collimating light directed toward the gas cell, and a lens element coupled the gas cell and configured for redirecting at least a portion of light that has passed through the gas cell. Additionally or alternatively, a gas cell of a magnetometer may be made of sapphire.

20 Claims, 7 Drawing Sheets

(56) References Cited

U.S. PATENT DOCUMENTS

| | | | |
|---|---|---|---|
| 3,513,381 | A | 5/1970 | Happer, Jr. |
| 4,193,029 | A | 3/1980 | Cioccio et al. |
| 4,951,674 | A | 8/1990 | Zanakis et al. |
| 5,189,368 | A | 2/1993 | Chase |
| 5,192,921 | A | 3/1993 | Chantry et al. |
| 5,225,778 | A | 7/1993 | Chaillout et al. |
| 5,254,947 | A | 10/1993 | Chaillout et al. |
| 5,309,095 | A | 5/1994 | Ahonen et al. |
| 5,442,289 | A | 8/1995 | Dilorio et al. |
| 5,444,372 | A | 8/1995 | Wikswo, Jr. et al. |
| 5,471,985 | A | 12/1995 | Warden |
| 5,506,200 | A | 4/1996 | Hirschkoff et al. |
| 5,526,811 | A | 6/1996 | Lypchuk |
| 5,713,354 | A | 2/1998 | Warden |
| 6,144,872 | A | 11/2000 | Graetz |
| 6,339,328 | B1 | 1/2002 | Keene et al. |
| 6,472,869 | B1 | 10/2002 | Upschulte et al. |
| 6,665,553 | B2 | 12/2003 | Kandori et al. |
| 6,806,784 | B2 | 10/2004 | Hollberg et al. |
| 6,831,522 | B2 | 12/2004 | Kitching et al. |
| 7,038,450 | B2 | 5/2006 | Romalis et al. |
| 7,102,451 | B2 | 9/2006 | Happer et al. |
| 7,145,333 | B2 | 12/2006 | Romalis et al. |
| 7,521,928 | B2 | 4/2009 | Romalis et al. |
| 7,656,154 | B2 | 2/2010 | Kawabata et al. |
| 7,826,065 | B1 | 11/2010 | Okandan et al. |
| 7,872,473 | B2 | 1/2011 | Kitching et al. |
| 7,994,783 | B2 | 8/2011 | Ledbetter et al. |
| 8,054,074 | B2 | 11/2011 | Ichihara et al. |
| 8,212,556 | B1 | 7/2012 | Schwindt et al. |
| 8,258,884 | B2 | 9/2012 | Borwick, III et al. |
| 8,319,156 | B2 | 11/2012 | Borwick, III et al. |
| 8,334,690 | B2 | 12/2012 | Kitching et al. |
| 8,373,413 | B2 | 2/2013 | Sugioka |
| 8,405,389 | B2 | 3/2013 | Sugioka et al. |
| 8,587,304 | B2 | 11/2013 | Budker et al. |
| 8,836,327 | B2 | 9/2014 | French et al. |
| 8,906,470 | B2 | 12/2014 | Overstolz et al. |
| 8,941,377 | B2 | 1/2015 | Mizutani et al. |
| 9,084,549 | B2 | 7/2015 | Desain et al. |
| 9,095,266 | B1 | 8/2015 | Fu |
| 9,116,201 | B2 | 8/2015 | Shah et al. |
| 9,140,590 | B2 | 9/2015 | Waters et al. |
| 9,140,657 | B2 | 9/2015 | Ledbetter et al. |
| 9,169,974 | B2 | 10/2015 | Parsa et al. |
| 9,244,137 | B2 | 1/2016 | Kobayashi et al. |
| 9,291,508 | B1 | 3/2016 | Biedermann et al. |
| 9,343,447 | B2 | 3/2016 | Parsa et al. |
| 9,366,735 | B2 | 6/2016 | Kawabata et al. |
| 9,383,419 | B2 | 7/2016 | Mizutani et al. |
| 9,395,425 | B2 | 7/2016 | Diamond et al. |
| 9,417,293 | B2 | 8/2016 | Schaffer et al. |
| 9,429,918 | B2 | 8/2016 | Parsa et al. |
| 9,568,565 | B2 | 2/2017 | Parsa et al. |
| 9,575,144 | B2 | 2/2017 | Kornack et al. |
| 9,601,225 | B2 | 3/2017 | Parsa et al. |
| 9,638,768 | B2 | 5/2017 | Foley et al. |
| 9,639,062 | B2 | 5/2017 | Dyer et al. |
| 9,677,905 | B2 | 6/2017 | Waters et al. |
| 9,726,626 | B2 | 8/2017 | Smith et al. |
| 9,726,733 | B2 | 8/2017 | Smith et al. |
| 9,791,536 | B1 | 10/2017 | Alem et al. |
| 9,829,544 | B2 | 11/2017 | Bulatowicz |
| 9,846,054 | B2 | 12/2017 | Waters et al. |
| 9,851,418 | B2 | 12/2017 | Wolf et al. |
| 9,869,731 | B1 | 1/2018 | Hovde et al. |
| 9,915,711 | B2 | 3/2018 | Kornack et al. |
| 9,927,501 | B2 | 3/2018 | Kim et al. |
| 9,948,314 | B2 | 4/2018 | Dyer et al. |
| 9,964,609 | B2 | 5/2018 | Ichihara et al. |
| 9,964,610 | B2 | 5/2018 | Shah et al. |
| 9,970,999 | B2 | 5/2018 | Larsen et al. |
| 9,995,800 | B1 | 6/2018 | Schwindt et al. |
| 10,024,929 | B2 | 7/2018 | Parsa et al. |
| 10,088,535 | B1 | 10/2018 | Shah |
| 10,162,016 | B2 | 12/2018 | Gabrys et al. |
| 10,194,865 | B2 | 2/2019 | Le et al. |
| 10,314,508 | B2 | 6/2019 | Desain et al. |
| 10,371,764 | B2 | 8/2019 | Morales et al. |
| 10,772,561 | B2 | 9/2020 | Donaldson |
| 2004/0232912 | A1 | 11/2004 | Tsukamoto et al. |
| 2005/0007118 | A1* | 1/2005 | Kitching ............... G04F 5/14 324/464 |
| 2005/0046851 | A1 | 3/2005 | Riley, Jr. et al. |
| 2005/0206377 | A1 | 9/2005 | Romalis et al. |
| 2007/0076776 | A1* | 4/2007 | Lust ..................... G04F 5/145 372/56 |
| 2007/0120563 | A1 | 5/2007 | Kawabata et al. |
| 2007/0167723 | A1 | 7/2007 | Park et al. |
| 2007/0205767 | A1 | 9/2007 | Xu et al. |
| 2009/0079426 | A1 | 3/2009 | Anderson |
| 2009/0101806 | A1 | 4/2009 | Masuda |
| 2009/0256561 | A1* | 10/2009 | Ledbetter et al. ... G01R 33/282 324/305 |
| 2010/0219820 | A1 | 9/2010 | Skidmore et al. |
| 2011/0062956 | A1 | 3/2011 | Edelstein et al. |
| 2012/0112749 | A1 | 5/2012 | Budker et al. |
| 2013/0082700 | A1 | 4/2013 | Mizutani et al. |
| 2013/0082701 | A1 | 4/2013 | Mizutani et al. |
| 2013/0265042 | A1* | 10/2013 | Kawabata ............. G01R 33/26 324/301 |
| 2014/0121491 | A1 | 5/2014 | Zhang |
| 2014/0308700 | A1 | 10/2014 | Kamada et al. |
| 2014/0354275 | A1 | 12/2014 | Sheng et al. |
| 2015/0022200 | A1 | 1/2015 | Ichihara et al. |
| 2015/0054504 | A1 | 2/2015 | Ichihara et al. |
| 2015/0378316 | A1 | 12/2015 | Parsa et al. |
| 2016/0061913 | A1 | 3/2016 | Kobayashi et al. |
| 2016/0116553 | A1* | 4/2016 | Kim ..................... G01R 33/032 324/305 |
| 2016/0223627 | A1 | 8/2016 | Shah et al. |
| 2016/0291099 | A1 | 10/2016 | Ueno |
| 2016/0313417 | A1 | 10/2016 | Kawabata et al. |
| 2017/0023653 | A1 | 1/2017 | Kobayashi et al. |
| 2017/0023654 | A1 | 1/2017 | Kobayashi et al. |
| 2017/0067969 | A1 | 3/2017 | Butters et al. |
| 2017/0199138 | A1 | 7/2017 | Parsa et al. |
| 2017/0199251 | A1* | 7/2017 | Fujii et al. ........... G01R 33/032 |
| 2017/0261564 | A1 | 9/2017 | Gabrys et al. |
| 2017/0331485 | A1 | 11/2017 | Gobet et al. |
| 2017/0343617 | A1 | 11/2017 | Manickam et al. |
| 2017/0343695 | A1 | 11/2017 | Stetson et al. |
| 2017/0356969 | A1 | 12/2017 | Ueno |
| 2017/0360322 | A1 | 12/2017 | Ueno |
| 2017/0363695 | A1 | 12/2017 | Ueno |
| 2018/0003777 | A1 | 1/2018 | Sorenson et al. |
| 2018/0038921 | A1 | 2/2018 | Parsa et al. |
| 2018/0100749 | A1 | 4/2018 | Waters et al. |
| 2018/0128885 | A1 | 5/2018 | Parsa et al. |
| 2018/0143265 | A1* | 5/2018 | Nagasaka ............. G01R 33/26 |
| 2018/0156875 | A1 | 6/2018 | Herbsommer et al. |
| 2018/0219353 | A1 | 8/2018 | Shah |
| 2018/0238974 | A1 | 8/2018 | Shah et al. |
| 2018/0306876 | A1* | 10/2018 | Parsa ................... G01R 33/26 |
| 2018/0313908 | A1 | 11/2018 | Knappe et al. |
| 2018/0313913 | A1 | 11/2018 | DeNatale et al. |
| 2018/0372813 | A1 | 12/2018 | Bulatowicz et al. |
| 2019/0391213 | A1 | 12/2019 | Alford |
| 2020/0025844 | A1 | 1/2020 | Alford et al. |
| 2020/0057115 | A1 | 2/2020 | Jiménez-Martínez et al. |
| 2020/0057116 | A1 | 2/2020 | Zorzos et al. |
| 2020/0064421 | A1 | 2/2020 | Kobayashi et al. |
| 2020/0072916 | A1 | 3/2020 | Alford et al. |
| 2020/0088811 | A1 | 3/2020 | Mohseni |
| 2020/0241094 | A1 | 7/2020 | Alford |
| 2020/0256929 | A1 | 8/2020 | Ledbetter et al. |
| 2020/0309873 | A1 | 10/2020 | Ledbetter et al. |
| 2020/0334559 | A1 | 10/2020 | Anderson et al. |
| 2020/0341081 | A1 | 10/2020 | Mohseni et al. |
| 2020/0381128 | A1 | 12/2020 | Pratt et al. |
| 2020/0400763 | A1 | 12/2020 | Pratt |
| 2021/0063510 | A1 | 3/2021 | Ledbetter |

(56) References Cited

U.S. PATENT DOCUMENTS

FOREIGN PATENT DOCUMENTS

| | | |
|---|---|---|
| CN | 107562188 | 1/2018 |
| EP | 2738627 A3 | 6/2014 |
| EP | 2380029 B1 | 10/2015 |
| EP | 3037836 B1 | 9/2017 |
| JP | 2012100839 | 5/2012 |
| JP | 2016109665 | 6/2016 |
| JP | 2018004462 | 1/2018 |
| WO | 2005/081794 | 9/2005 |
| WO | 2014/031985 | 2/2014 |
| WO | 2017/095998 | 6/2017 |

OTHER PUBLICATIONS

Haifeng Dong et al: "Atomic-Signal-Based Zero-Field Finding Technique for Unshielded Atomic Vector Magnetometer", IEEE Sensors Journal, IEEE Service Center, New York, NY, US, vol. 13, No. 1, Jan. 1, 2013 (Jan. 1, 2013), pp. 186-189.
Hill RM, Boto E, Holmes N, et al. A tool for functional brain imaging with lifespan compliance [published correction appears in Nat Commun. Dec. 4, 2019;10(1):5628]. Nat Commun. 2019;10(1):4785. Published Nov. 5, 2019. doi:10.1038/s41467-019-12486-x.
Zetter, R., Iivanainen, J. & Parkkonen, L. Optical Co-registration of MRI and On-scalp MEG. Sci Rep 9, 5490 (2019). https://doi.org/10.1038/s41598-019-41763-4.
Garrido-Jurado, Sergio, Rafael Muñoz-Salinas, Francisco José Madrid-Cuevas and Manuel J. Marín-Jiménez. "Automatic generation and detection of highly reliable fiducial markers under occlusion." Pattern Recognit. 47 (2014): 2280-2292.
Hill RM, Boto E, Rea M, et al. Multi-channel whole-head OPM-MEG: Helmet design and a comparison with a conventional system [published online ahead of print, May 29, 2020]. Neuroimage. 2020;219:116995. doi:10.1016/j.neuroimage.2020.116995.
V. Kazemi and J. Sullivan, "One millisecond face alignment with an ensemble of regression trees," 2014 IEEE Conference on Computer Vision and Pattern Recognition, Columbus, OH, 2014, pp. 1867-1874, doi: 10.1109/CVPR.2014.241.
Holmes, N., Tierney, T.M., Leggett, J. et al. Balanced, bi-planar magnetic field and field gradient coils for field compensation in wearable magnetoencephalography. Sci Rep 9, 14196 (2019).
N. Holmes, J. Leggett, E. Boto, G. Roberts, R.M. Hill, T.M. Tierney, V. Shah, G.R. Barnes, M.J. Brookes, R. Bowtell A bi-planar coil system for nulling background magnetic fields in scalp mounted magnetoencephalography Neuroimage, 181 (2018), pp. 760-774.
J. M. Leger et. al., In-flight performance of the Absolute Scalar Magnetometer vector mode on board the Swarm satellites, Earth, Planets, and Space (2015) 67:57.
Alexandrov, E. B., Balabas, M. V., Kulyasov, V. N., Ivanov, A. E., Pazgalev, A. S., Rasson, J. L., . . . (2004). Three-component variometer based on a scalar potassium sensor. Measurement Science and Technology, 15(5), 918-922.
Gravrand, O., Khokhlov, A., & JL, L. M. (2001). On the calibration of a vectorial 4He pumped magnetometer. Earth, planets and space , 53 (10), 949-958.
Borna, Amir & Carter, Tony & Colombo, Anthony & Jau, Y-Y & McKay, Jim & Weisend, Michael & Taulu, Samu & Stephen, Julia & Schwindt, Peter. (2018). Non-Invasive Functional-Brain-Imaging with a Novel Magnetoencephalography System. 9 Pages.
Vrba J, Robinson SE. Signal processing in magnetoencephalography. Methods. 2001;25(2):249-271. doi:10.1006/meth.2001.1238.
Uusitalo M and Ilmoniemi R., 1997, Signal-space projection method for separating MEG or EEG into components. Med. Biol. Comput. (35) 135-140.
Taulu S and Kajola M., 2005, Presentation of electromagnetic multichannel data: the signal space separation method. J. Appl. Phys. (97) 124905 (2005).
Taulu S, Simola J and Kajola M., 2005, Applications of the signal space separation method. IEEE Trans. Signal Process. (53) 3359-3372 (2005).
Taulu S, Simola J., 2006, Spatiotemporal signal space separation method for rejecting nearby interference in MEG measurements. Phys. Med. Biol. (51) 1759-1768 (2006).
Johnson, et al., Magnetoencephalography with a two-color pump-probe, fiber-coupled atomic magnetometer, Applied Physics Letters 97, 243703 2010.
Zhang, et al., Magnetoencephalography using a compact multichannel atomic magnetometer with pump-probe configuration, AIP Advances 8, 125028 (2018).
Xia, H. & Ben-Amar Baranga, Andrei & Hoffman, D. & Romalis, Michael. (2006). Magnetoencephalography with an atomic magnetometer. Applied Physics Letters—Appl Phys Lett. 89. 10.1063/1.2392722.
Ilmoniemi, R. (2009). The triangle phantom in magnetoencephalography. In 24th Annual Meeting of Japan Biomagnetism and Bioelecctromagnetics Society, Kanazawa, Japan, 28.29.5.2009 (pp. 6263).
Oyama D. Dry phantom for magnetoencephalography—Configuration, calibration, and contribution. J Neurosci Methods. 2015;251:24-36. doi: 0.1016/j.jneumeth.2015.05.004.
Chutani, R., Maurice, V., Passilly, N. et al. Laser light routing in an elongated micromachined vapor cell with diffraction gratings for atomic clock applications. Sci Rep 5, 14001 (2015). https://doi.org/10.1038/srep14001.
Eklund, E. Jesper, Andrei M. Shkel, Svenja Knappe, Elizabeth A. Donley and John Kitching. "Glass-blown spherical microcells for chip-scale atomic devices." (2008).
Jiménez-Martínez R, Kennedy DJ, Rosenbluh M, et al. Optical hyperpolarization and NMR detection of 129Xe on a microfluidic chip. Nat Commun. 2014;5:3908. Published May 20, 2014. doi:10.1038/ncomms4908.
Boto, Elena, Sofie S. Meyer, Vishal Shah, Orang Alem, Svenja Knappe, Peter Kruger, T. Mark Fromhold, et al. "A New Generation of Magnetoencephalography: Room Temperature Measurements Using Optically-Pumped Magnetometers." NeuroImage 149 (Apr. 1, 2017): 404-14.
Bruno, A. C., and P. Costa Ribeiro. "Spatial Fourier Calibration Method for Multichannel SQUID Magnetometers." Review of Scientific Instruments 62, No. 4 (Apr. 1, 1991): 1005-9.
Chella, Federico, Filippo Zappasodi, Laura Marzetti, Stefania Della Penna, and Vittorio Pizzella. "Calibration of a Multichannel MEG System Based on the Signal Space Separation Method." Physics in Medicine and Biology 57 (Jul. 13, 2012): 4855-70.
Pasquarelli, A, M De Melis, Laura Marzetti, Hans-Peter Müller, and S N Erné. "Calibration of a Vector-MEG Helmet System." Neurology & Clinical Neurophysiology□: NCN 2004 (Feb. 1, 2004): 94.
Pfeiffer, Christoph, Lau M. Andersen, Daniel Lundqvist, Matti Hämäläinen, Justin F. Schneiderman, and Robert Oostenveld. "Localizing On-Scalp MEG Sensors Using an Array of Magnetic Dipole Coils." PLOS One 13, No. 5 (May 10, 2018): e0191111.
Vivaldi, Valentina, Sara Sommariva, and Alberto Sorrentino. "A Simplex Method for the Calibration of a MEG Device." Communications in Applied and Industrial Mathematics 10 (Jan. 1, 2019): 35-46.
Nagel, S., & Spüler, M. (2019). Asynchronous non-invasive high-speed BCI speller with robust non-control state detection. Scientific Reports, 9(1), 8269.
Thielen, J., van den Broek, P., Farquhar, J., & Desain, P. (2015). Broad-Band Visually Evoked Potentials: Re(con) volution in Brain-Computer Interfacing. PloS One, 10(7), e0133797. https://doi.org/10.1371/journal.pone.0133797.
J. Kitching, "Chip-scale atomic devices," Appl. Phys. Rev. 5(3), 031302 (2018), 39 pages.
Manon Kok, Jeroen D. Hol and Thomas B. Schon (2017), "Using Inertial Sensors for Position and Orientation Estimation", Foundations and Trends in Signal Processing: vol. 11: No. 1-2, pp. 1-153. http://dx.doi.org/10.1561/2000000094.
Tierney, T. M., Holmes, N., Meyer, S. S., Boto, E., Roberts, G., Leggett, J., . . . Barnes, G. R. (2018). Cognitive neuroscience using wearable magnetometer arrays: Non-invasive assessment of language function. NeuroImage, 181, 513-520.

(56) References Cited

OTHER PUBLICATIONS

Boto, E, Holmes, N, Leggett, J, Roberts, G, Shah, V, Meyer, SS, Muñoz, LD, Mullinger, KJ, Tierney, TM, Bestmann, S, Barnes, GR, Bowtell, R & Brookes, MJ 2018, 'Moving magnetoencephalography towards real world applications with a wearable system', Nature, vol. 555, pp. 657-661.

Ijsselsteijn, R & Kielpinski, Mark & Woetzel, S & Scholtes, Theo & Kessler, Ernst & Stolz, Ronny & Schultze, V & Meyer, H-G. (2012). A full optically operated magnetometer array: An experimental study. The Review of scientific instruments. 83. 113106. 10.1063/1.4766961.

Allred, J. C., Lyman, R. N., Kornack, T. W., & Romalis, M. V. (2002). High-sensitivity atomic magnetometer unaffected by spin-exchange relaxation. Physical review letters, 89(13), 130801.

Balabas et al. Polarized alkali vapor with minute-long transverse spin-relaxation time, Phys. Rev. Lett. 105, 070801—Published Aug. 12, 2010.

Barbieri, F., Trauchessec, V., Caruso, L., Trejo-Rosillo, J., Telenczuk, B., Paul, E., . . . & Ouanounou, G. (2016). Local recording of biological magnetic fields using Giant Magneto Resistance-based micro-probes. Scientific reports, 6, 39330.

Dmitry Budker and Michael Romalis, "Optical Magnetometry," Nature Physics, 2008, https://arxiv.org/abs/physics/0611246v1.

Anthony P. Colombo, Tony R. Carter, Amir Borna, Yuan-Yu Jau, Cort N. Johnson, Amber L. Dagel, and Peter D. D. Schwindt, "Four-channel optically pumped atomic magnetometer for magnetoencephalography," Opt. Express 24, 15403-15416 (2016).

Dang, H.B. & Maloof, A.C. & Romalis, Michael. (2009). Ultra-high sensitivity magnetic field and magnetization measurements with an atomic magnetometer. Applied Physics Letters. 97. 10.1063/1.3491215.

Donley, E.A. & Hodby, E & Hollberg, L & Kitching, J. (2007). Demonstration of high-performance compact magnetic shields for chip-scale atomic devices. The Review of scientific instruments. 78. 083102.

Hämäläinen, Matti & Hari, Riitta & Ilmoniemi, Risto J. & Knuutila, Jukka & Lounasmaa, Olli V. Apr. 1993. Magnetoencephalograph—theory, instrumentation, and applications to noninvasive studies of the working human brain. Reviews of Modern Physics. vol. 65, Issue 2, 413-497.

Hunter, D. and Piccolomo, S. and Pritchard, J. D. and Brockie, N. L. and Dyer, T. E. and Riis, E. (2018) Free-induction-decay magnetometer based on a microfabricated Cs vapor cell. Physical Review Applied (10).ISSN 2331-7019.

Jiménez-Martínez, R., Griffith, W. C., Wang, Y. J., Knappe, S., Kitching, J., Smith, K., & Prouty, M. D. (2010). Sensitivity comparison of Mx and frequency-modulated bell-bloom Cs magnetometers in a microfabricated cell. IEEE Transactions on Instrumentation and Measurement, 59(2), 372-378.

Kiwoong Kim, Samo Begus, Hui Xia, Seung-Kyun Lee, Vojko Jazbinsek, Zvonko Trontelj, Michael V. Romalis, Multi-channel atomic magnetometer for magnetoencephalography: A configuration study. NeuroImage 89 (2014) 143-151 http://physics.princeton.edu/romalis/papers/Kim_2014.pdf.

Knappe, Svenja & Sander, Tilmann & Trahms, Lutz. (2012). Optically-Pumped Magnetometers for MEG. Magnetoencephalography: From Signals to Dynamic Cortical Networks. 993-999. 10.1007/978-3-642-33045-2_49. —.

Kominis, I.K., Kornack, T.W., Allred, J.C. and Romalis, M.V., 2003. A subfemtotesla multichannel atomic magnetometer. Nature, 422(6932), p. 596.

Korth, H., K. Strohbehn, F. Tejada, A. G. Andreou, J. Kitching, S. Knappe, S. J. Lehtonen, S. M. London, and M. Kafel (2016), Miniature atomic scalarmagnetometer for space based on the rubidium isotope 87Rb, J. Geophys. Res. Space Physics, 121, 7870-7880, doi:10.1002/2016JA022389.

Lenz, J. and Edelstein, S., 2006. Magnetic sensors and their applications. IEEE Sensors journal, 6(3), pp. 631-649.

Li, S & Vachaspati, Pranjal & Sheng, Dehong & Dural, Nezih & Romalis, Michael. (2011). Optical rotation in excess of 100 rad generated by Rb vapor in a multipass cell. Phys. Rev. A. 84. 10.1103/PhysRevA.84.061403.

Maze, J. R., Stanwix, P. L., Hodges, J. S., Hong, S., Taylor, J. M., Cappellaro, P., . . . & Yacoby, A. (2008). Nanoscale magnetic sensing with an individual electronic spin in diamond. Nature, 455(7213), 644.

Sander TH, Preusser J, Mhaskar R, Kitching J, Trahms L, Knappe S. Magnetoencephalography with a chip-scale atomic magnetometer. Biomed Opt Express. 2012;3(5):981-90.

J. Seltzer, S & Romalis, Michael. (2010). High-temperature alkali vapor cells with antirelaxation surface coatings. Journal of Applied Physics. 106. 114905-114905. 10.1063/1.3236649.

Seltzer, S. J., and Romalis, M.V., "Unshielded three-axis vector operation of a spin-exchange-relaxation-free atomic magnetometer." Applied physics letters 85.20 (2004): 4804-4806.

Sheng, Dong & R. Perry, Abigail & Krzyzewski, Sean & Geller, Shawn & Kitching, John & Knappe, Svenja. (2017). A microfabricated optically-pumped magnetic gradiometer. Applied Physics Letters. 110. 10.1063/1.4974349.

Sheng, Dehong & Li, S & Dural, Nezih & Romalis, Michael. (2013). Subfemtotesla Scalar Atomic Magnetometry Using Multipass Cells. Physical review letters. 110. 160802. 10.1103/PhysRevLett.110.160802.

Volkmar Schultze et al. An Optically Pumped Magnetometer Working in the Light-Shift Dispersed Mz Mode, Sensors 2017, 17, 561; doi:10.3390/s17030561.

Fang, J. and Qin, J., 2012. In situ triaxial magnetic field compensation for the spin-exchange-relaxation-free atomic magnetometer. Review of Scientific Instruments, 83(10), p. 103104.

Joon Lee, Hyun & Shim, Jeong & Moon, Han Seb & Kim, Kiwoong. (2014). Flat-response spin-exchange relaxation free atomic magnetometer under negative feedback. Optics Express. 22. 10.1364/OE.22.019887.

Griffith, Clark & Jimenez-Martinez, Ricardo & Shah, Vishal & Knappe, Svenja & Kitching, John. (2009). Miniature atomic magnetometer integrated with flux concentrators. Applied Physics Letters—Appl Phys Lett. 94. 10.1063/1.3056152.

Lee, S.-K & Romalis, Michael. (2008). Calculation of Magnetic Field Noise from High-Permeability Magnetic Shields and Conducting Objects with Simple Geometry. Journal of Applied Physics. 103. 084904-084904. 10.1063/1.2885711.

Vovrosh, Jamie & Voulazeris, Georgios & Petrov, Plamen & Zou, Ji & Gaber Beshay, Youssef & Benn, Laura & Woolger, David & Attallah, Moataz & Boyer, Vincent & Bongs, Kai & Holynski, Michael. (2018). Additive manufacturing of magnetic shielding and ultra-hign vacuum flange for cold atom sensors. Scientific Reports. 8. 10.1038/s41598-018-20352-x.

Kim, Young Jin & Savukov, I. (2016). Ultra-sensitive Magnetic Microscopy with an Optically Pumped Magnetometer. Scientific Reports. 6. 24773. 10.1038/srep24773.

Navau, Carles & Prat-Camps, Jordi & Sanchez, Alvaro. (2012). Magnetic Energy Harvesting and Concentration at a Distance by Transformation Optics. Physical review letters. 109. 263903. 10.1103/PhysRevLett.109.263903.

Orang Alem, Rahul Mhaskar, Ricardo Jiménez-Martínez, Dong Sheng, John LeBlanc, Lutz Trahms, Tilmann Sander, John Kitching, and Svenja Knappe, "Magnetic field imaging with microfabricated optically-pumped magnetometers," Opt. Express 25, 7849-7858 (2017).

Slocum et al., Self-Calibrating Vector Magnetometer for Space, https://esto.nasa.gov/conferences/estc-2002/Papers/B3P4(Slocum).pdf.

Dupont-Roc, J & Haroche, S & Cohen-Tannoudji, C. (1969). Detection of very weak magnetic fields (10-9gauss) by 87Rb zero-field level crossing resonances. Physics Letters A—Phys Lett A. 28. 638-639. 10.1016/0375-9601(69)90480-0.

J. A. Neuman, P. Wang, and A. Gallagher, Robust high-temperature sapphire cell for metal vapors, Review of Scientific Instruments, vol. 66, Issue 4, Apr. 1995, pp. 3021-3023.

(56) References Cited

OTHER PUBLICATIONS

Borna, Amir, et al. "A 20-channel magnetoencephalography system based on optically pumped magnetometers." Physics in Medicine & Biology 62.23 (2017): 8909.
R. E. Slocum & L. J. Ryan, Design and operation of the minature vector laser magnetometer, Nasa Earth Science Technology Conference 2003.
Schoenmaker, Jeroen & R Pirota, K & Teixeira, Julio. (2013). Magnetic flux amplification by Lenz lenses. The Review of scientific instruments. 84. 085120. 10.1063/1.4819234.
Hu, Yanhui & Hu, Zhaohui & Liu, Xuejing & Li, Yang & Zhang, Ji & Yao, Han & Ding, Ming. (2017). Reduction of far off-resonance laser frequency drifts based on the second harmonic of electro-optic modulator detection in the optically pumped magnetometer. Applied Optics. 56. 5927. 10.1364/AO.56.005927.
Masuda, Y & Ino, T & Skoy, Vadim & Jones, G.L. (2005). 3He polarization via optical pumping in a birefringent cell. Applied Physics Letters. 87. 10.1063/1.2008370.
A.B. Baranga et al., An atomic magnetometer for brain activity imaging, Real Time Conference 2005. 14th IEEE—NPSS. pp. 417-418.
Larry J. Ryan, Robert E. Slocum, and Robert B. Steves, Miniature Vector Laser Magnetometer Measurements of Earth's Field, May 10, 2004, 4 pgs.
Lorenz, V. O., Dai, X., Green, H., Asnicar, T. R., & Cundiff, S. T. (2008). High-density, high-temperature alkali vapor cell. Review of Scientific Instruments, 79(12), 4 pages.
F. Jackson Kimball, D & Dudley, J & Li, Y & Thulasi, Swecha & Pustelny, Szymon & Budker, Dmitry & Zolotorev, Max. (2016). Magnetic shielding and exotic spin-dependent interactions. Physical Review D. 94. 10.1103/PhysRevD.94.082005.
Huang, Haichao, et al. "Single-beam three-axis atomic magnetometer." Applied Physics Letters 109.6 (2016): 062404. (Year: 2016).
International Search Report and Written Opinion for PCT Application No. PCT/US2019/033320 dated Aug. 21, 2019.
Arjen Stolk, Ana Todorovic, Jan-Mathijs Schoffelen, and Robert Oostenveld. "Online and offline tools for head movement compensation in MEG." Neuroimage 68 (2013): 39-48.
Bagherzadeh, Yasaman, Daniel Baldauf, Dimitrios Pantazis, and Robert Desimone. "Alpha synchrony and the neurofeedback control of spatial attention." Neuron 105, No. 3 (2020): 577-587.
Okada, Y.C., Lahteenmäki, A. and Xu, C., "Experimental analysis of distortion of magnetoencephalography signals by the skull." Clinical neurophysiology 110 (2), 230-238 (1999).
Robinson, J.T., Pohlmeyer, E., Gather, M.C., Kemere, C., Kitching, J.E., Malliaras, G.G., Marblestone, A., Shepard, K.L., Stieglitz, T. and Xie, C., "Developing Next-Generation Brain Sensing Technologies—A Review." IEEE sensors journal, 19(22), 10163-10175 (2019).
Shah, V., Knappe, S., Schwindt, P.D. and Kitching, J., "Subpicotesla atomic magnetometry with a microfabricated vapour cell." Nature Photon 1, 649-652 (2007).
Griffith, W.C., Knappe, S. and Kitching, J., "Femtotesla atomic magnetometry in a microfabricated vapor cell." Optics express 18, (26), 27167-27172 (2010).
Tierney, T.M., Holmes, N., Mellor, S., López, J.D., Roberts, G., Hill, R.M., Boto, E., Leggett, J., Shah, V., Brookes, M.J. and Bowtell, R., "Optically pumped magnetometers: From quantum origins to multi-channel magnetoencephalography." NeuroImage, 199, 598-608 (2019).
Iivanainen, J., Zetter, R., Grön, M., Hakkarainen, K. and Parkkonen, L., "On-scalp MEG system utilizing an actively shielded array of optically-pumped magnetometers." Neuroimage 194, 244-258 (2019).
Iivanainen, J., Stenroos, M. and Parkkonen, L., "Measuring MEG closer to the brain: Performance of on-scalp sensor arrays." NeuroImage 147, 542-553 (2017).
Kitching, J., Knappe, S., Gerginov, V., Shah, V., Schwindt, P.D., Lindseth, B., Donley E.A., "Chip-scale atomic devices: precision atomic instruments based on MEMS." In Frequency Standards and Metrology, 445-453 (2009).
Kitching, J., Knappe, S. and Donley, E.A., "Atomic sensors—a review." IEEE Sensors Journal, 11(9), 1749-1758 (2011).
Budker, D. and Romalis, M., "Optical magnetometry". Nature physics, 3(4), 227-234 (2007).
Happer, W., "Optical pumping", Rev. Mod. Phys., 44 (2), 169-249 (1972).
Purcell, E.M., Field, G.B., "Influence of collisions upon population of hyperfine states in hydrogen", Astrophys. J., 124, 542 (1956).
Ledbetter, M.P., Savukov, I.M., Acosta, V.M., Budker, D. and Romalis, M.V., "Spin-exchange-relaxation-free magnetometry with Cs vapor." Physical Review A, 77(3), 033408 (2008).
Bloom, A. L., "Principles of operation of the rubidium vapor magnetometer." Applied Optics 1(1), 61-68 (1962).
Bell, W.E., and Bloom, A.L., "Optically driven spin precession." Physical Review Letters 6, (6), 280 (1961).
Roberts, G., Holmes, N., Alexander, N., Boto, E., Leggett, J., Hill, R.M., Shah, V., Rea, M., Vaughan, R., Maguire, E.A. and Kessler, K., "Towards OPM-MEG in a virtual reality environment." NeuroImage, 199, 408-417 (2019).
Zhang, R., Xiao, W., Ding, Y., Feng, Y., Peng, X., Shen, L., Sun, C., Wu, T., Wu, Y., Yang, Y. and Zheng, Z., "Recording brain activities in unshielded Earth's field with optically pumped atomic magnetometers." Science Advances, 6(24) (2020).
De Cheveigné, A., Wong, D.D., Di Liberto, G.M., Hjortkjaer, J., Slaney, M. and Lalor, E., "Decoding the auditory brain with canonical component analysis." NeuroImage, 172, 206-216 (2018).
Mellinger, J., Schalk, G., Braun, C., Preissl, H., Rosenstiel, W., Birbaumer, N. and Kübler, A., "An MEG-based brain-computer interface (BCI)." Neuroimage, 36(3), 581-593 (2007).
Wolpaw, J.R., McFarland, D.J., Neat, G.W. and Forneris, C.A., "An EEG-based brain-computer interface for cursor control." Electroencephalography and clinical neurophysiology, 78(3), 252-259 (1991).
Lightfoot, G., "Summary of the N1-P2 cortical auditory evoked potential to estimate the auditory threshold in adults". Seminars in hearing, 37(1), 1 (2016).
Virtanen, J., Ahveninen, J., Ilmoniemi, R. J., Näätänen, R., & Pekkonen, E., "Replicability of MEG and EEG measures of the auditory N1/N1m-response." Electroencephalography and Clinical Neurophysiology/Evoked Potentials Section, 108(3), 291-298 (1998).
Gascoyne, L., Furlong, P. L., Hillebrand, A., Worthen, S. F., & Witton, C., "Localising the auditory N1m with event-related beamformers: localisation accuracy following bilateral and unilateral stimulation." Scientific reports, 6(1), 1-9 (2016).
Borna, A., Carter, T.R., Goldberg, J.D., Colombo, A.P., Jau, Y.Y., Berry, C., McKay, J., Stephen, J., Weisend, M. and Schwindt, P.D., "A 20-channel magnetoencephalography system based on optically pumped magnetometers." Physics in Medicine & Biology, 62(23), 8909 (2017).
Pyragius, T., Marin Florez, H., & Fernholz, T. (2019). A Voigt effect based 3D vector magnetometer. Physical Review A, 100(2), https://doi.org/10.1103/PhysRevA.100.023416.
Rui Zhang, Rahul Mhaskar, Ken Smith, Easswar Balasubramaniam, Mark Prouty. "All Optical Scalar Atomic Magnetometer Capable of Vector Measurement," Submitted on Nov. 17, 2020. https://arxiv.org/abs/2011.08943; Geometrics, Inc., San Jose, CA, 95131, USA.

\* cited by examiner

INTEGRATED GAS CELL AND OPTICAL COMPONENTS FOR ATOMIC MAGNETOMETRY AND METHODS FOR MAKING AND USING

CROSS-REFERENCE TO RELATED APPLICATIONS

This application claims the benefit of U.S. Provisional Patent Application Ser. Nos. 62/719,471, filed Aug. 17, 2018; and 62/741,777, filed Oct. 5, 2018, both of which are incorporated herein by reference in their entirety.

FIELD

The present disclosure is directed to the area of magnetic field measurement systems using optically pumped magnetometers. The present disclosure is also directed to magnetic field measurement systems that include a gas cell with integrated optical components.

BACKGROUND

In the nervous system, neurons communicate with one another via action potentials. These are brief electric currents which flow down the length of a neuron causing chemical transmitters to be released at a synapse. The time-varying electrical current within the neuron generates a magnetic field, which propagates through the human head and can be measured using either a Superconductive Quantum Interference Device (SQUID) or an Optically Pumped Magnetometer (OPM). One challenge with a SQUID detector is that it requires cryogenic cooling which can be costly and bulky.

Spin-Exchange Relaxation-Free (SERF) OPMs can achieve femto-Tesla/(Hz)$^{1/2}$ sensitivities and can detect magnetoencephalography (MEG). In these sensors the rate of spin-exchange collisions, Rse, among alkali metals, which typically introduce decoherence, is much faster than the Larmor precession rate $\omega_0=\gamma|B|$, with $\gamma$ being the gyromagnetic ratio of the atom and the strength of the magnetic field $|B|$. The spin-exchange collision rate is given by Rse=$\sigma_{se}$v$n_{Al}$, with the cross-section for SE collisions $\sigma_{se}$=2× $10^{-14}$ cm$^2$, the relative thermal speed of two colliding alkali metal atoms v~$10^4$ cm/s at the temperature of 150° C., and $n_{Al}$ denoting the alkali metal vapor density. For many practical purposes, the SERF regime or mode is achieved when Rse>10$\omega_0$, which conventionally occurs at low magnetic fields Bo and large densities. For this reason, SERF OPMs have historically required a magnetic shield enclosure to reduce the Earth's magnetic field by a factor of greater than 1000× to function properly. In the field of magnetics, this is referred to as passive shielding. These systems can achieve very high signal-to-noise ratios and can measure biologically generated fields caused by neural activity as stated above. However, the size and cost of this magnetic shielding may make the use of these systems prohibitive.

BRIEF SUMMARY

One embodiment is a magnetometer that includes a single, integrated, unitary structure. This structure includes a gas cell defining a cavity having a vapor or vaporizable material disposed therein, a collimating element coupled to the gas cell and configured for collimating light directed toward the gas cell, and a lens element coupled the gas cell and configured for redirecting at least a portion of light that has passed through the gas cell.

In at least some embodiments, the lens element is formed in a wall of the gas cell. In at least some embodiments, the single, integrated, unitary structure further includes a quarter wave plate between the collimating element and the gas cell. In at least some embodiments, the quarter wave plate and collimating optical element are formed in a wall of the gas cell.

In at least some embodiments, the magnetometer further includes a light source configured and arranged for illuminating the gas cell through the collimating element. In at least some embodiments, the magnetometer further includes a light detector configured and arranged for receiving light passing through the gas cell and the lens element. In at least some embodiments, the magnetometer further includes a heater configured to heat the gas cell.

In at least some embodiments, the magnetometer further includes an assembly chamber within which the single, integrated, unitary structure is disposed. In at least some embodiments, the magnetometer further includes a microfluidic channel through the assembly chamber and into the gas cell. In at least some embodiments, the magnetometer further includes a microfluidic channel into the assembly chamber.

In at least some embodiments, walls of the gas cell are formed of sapphire. In at least some embodiments, the single, integrated, unitary structure is formed of sapphire.

Another embodiment is a magnetometer that includes a gas cell made of sapphire and defining a chamber having a vapor or vaporizable material disposed therein; a heater coupled to the gas cell and configured to heat the vapor or vaporizable material to at least 100° C.; and a magnetic field generator configured to generate a magnetic field at the gas cell.

In at least some embodiments, the magnetometer further includes a light source configured and arranged to direct light through the gas cell and a detector configured and arranged to receive light from the light source that passes through the gas cell. In at least some embodiments, the gas cell further includes a lens element formed in a wall of the gas cell. In at least some embodiments, the gas cell further includes a wave plate formed in a wall of the gas cell. In at least some embodiments, the gas cell further includes a collimating element formed in a wall of the gas cell. In at least some embodiments, the heater is configured to heat the vapor or vaporizable material to at least 300° C.

Yet another embodiment is a magnetic field measurement system that includes any of the magnetometers described above. The magnetic field measurement system may include a light source configured and arranged to direct light through the gas cell.

The magnetic field measurement system may include a detector configured and arranged to receive light from the light source that passes through the gas cell. The magnetic field measurement system may include a magnetic field generator configured to generate a magnetic field at the magnetometer.

BRIEF DESCRIPTION OF THE DRAWINGS

Non-limiting and non-exhaustive embodiments of the present invention are described with reference to the following drawings. In the drawings, like reference numerals refer to like parts throughout the various figures unless otherwise specified.

For a better understanding of the present invention, reference will be made to the following Detailed Description, which is to be read in association with the accompanying drawings, wherein.

DETAILED DESCRIPTION

The present disclosure is directed to the area of magnetic field measurement systems using optically pumped magnetometers. The present disclosure is also directed to magnetic field measurement systems that include a gas cell with integrated optical components.

Optical magnetometry is the use of optical methods to measure a magnetic field with very high accuracy—for example, on the order of $1 \times 10^{-15}$ Tesla. An optically pumped magnetometer (OPM) is a fundamental element used in optical magnetometry to measure magnetic fields. A magnetic field measurement system, as described herein, can include one or more (for example, an array of) optically pumped magnetometers, for example, one or more SERF zero-field vector magnetometers. The magnetic field measurement system can be used to measure or observe electromagnetic signals generated by one or more sources (for example, biological sources). The system can measure biologically generated magnetic fields and, at least in some embodiments, can measure biologically generated magnetic fields in an unshielded environment. Aspects of a magnetic field measurement system will be exemplified below using magnetic signals from the brain of a user; however, biological signals from other areas of the body, as well as non-biological signals, can be measured using the system. Uses for this technology outside biomedical sensing include, but are not limited to, navigation, mineral exploration, non-destructive testing, detection of underground devices, asteroid mining, and space travel. In at least some embodiments, the system can be a non-invasive wearable MEG system that can be used outside a magnetically shielded room.

Examples of non-invasive magnetic field measurement applications systems or methods are described in U.S. patent application Ser. No. 16/364,338 and U.S. Provisional Patent Application Ser. Nos. 62/829,124 and 62/839,405, all of which are incorporated herein by reference.

Herein the terms "ambient background magnetic field" and "background magnetic field" are interchangeable and used to identify the magnetic field or fields associated with sources other than the magnetic field measurement system and the biological source(s) (for example, neural signals from a user's brain) or other source(s) of interest. The terms can include, for example, the Earth's magnetic field, as well as magnetic fields from magnets, electromagnets, electrical devices, and other signal or field generators in the environment, except for the magnetic field generator(s) that are part of the magnetic field measurement system.

The terms "gas cell", "vapor cell", and "vapor gas cell" are used interchangeably herein. Below, a gas cell containing alkali metal vapor is described, but it will be recognized that other gas cells can contain different gases or vapors for operation.

Figure 1A:
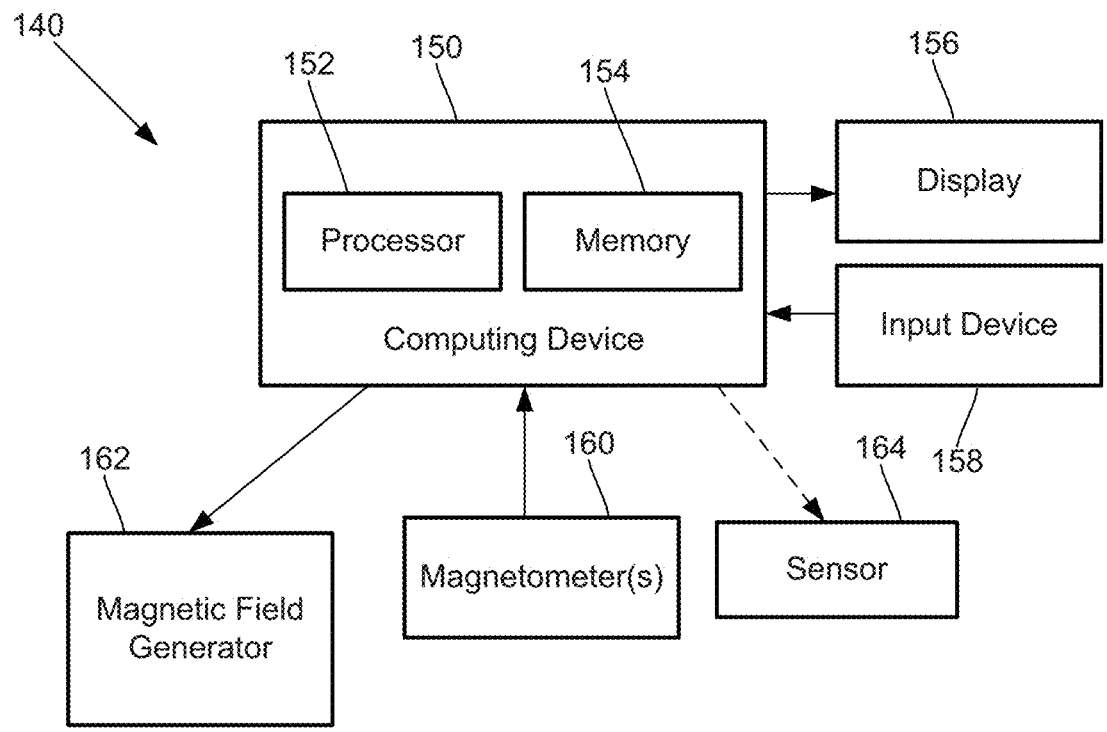
FIG. 1A is a schematic block diagram of one embodiment of a magnetic field measurement system, according to the invention.

FIG. 1A is a block diagram of components of one embodiment of a magnetic field measurement system 140. The system 140 can include a computing device 150 or any other similar device that includes a processor 152 and a memory 154, a display 156, an input device 158, one or more magnetometers 160 (for example, one or more vector magnetometers), one or more magnetic field generators 162, and, optionally, one or more sensors 164. The system 140 and its use and operation will be described herein with respect to the measurement of neural signals arising from signal sources in the brain of a user as an example. It will be understood, however, that the system can be adapted and used to measure other neural signals, other biological signals, as well as non-biological signals.

The computing device 150 can be a computer, tablet, mobile device, or any other suitable device for processing information. The computing device 150 can be local to the user or can include components that are non-local to the user including one or both of the processor 152 or memory 154 (or portions thereof). For example, in at least some embodiments, the user may operate a terminal that is connected to a non-local computing device. In other embodiments, the memory 154 can be non-local to the user.

The computing device 150 can utilize any suitable processor 152 including one or more hardware processors that may be local to the user or non-local to the user or other components of the computing device. The processor 152 is configured to execute instructions provided to the processor 152, as described below.

Any suitable memory 154 can be used for the computing device 150. The memory 154 illustrates a type of computer-readable media, namely computer-readable storage media. Computer-readable storage media may include, but is not limited to, nonvolatile, non-transitory, removable, and non-removable media implemented in any method or technology for storage of information, such as computer readable instructions, data structures, program modules, or other data. Examples of computer-readable storage media include RAM, ROM, EEPROM, flash memory, or other memory technology, CD-ROM, digital versatile disks ("DVD") or other optical storage, magnetic cassettes, magnetic tape, magnetic disk storage or other magnetic storage devices, or any other medium which can be used to store the desired information and which can be accessed by a computing device.

Communication methods provide another type of computer readable media; namely communication media. Communication media typically embodies computer-readable instructions, data structures, program modules, or other data in a modulated data signal such as a carrier wave, data signal, or other transport mechanism and include any information delivery media. The terms "modulated data signal," and "carrier-wave signal" includes a signal that has one or more of its characteristics set or changed in such a manner as to encode information, instructions, data, and the like, in the signal. By way of example, communication media includes wired media such as twisted pair, coaxial cable, fiber optics, wave guides, and other wired media and wireless media such as acoustic, RF, infrared, and other wireless media.

The display 156 can be any suitable display device, such as a monitor, screen, or the like, and can include a printer. In some embodiments, the display is optional. In some embodiments, the display 156 may be integrated into a single unit with the computing device 150, such as a tablet, smart phone, or smart watch. The input device 158 can be, for example, a keyboard, mouse, touch screen, track ball, joystick, voice recognition system, or any combination thereof, or the like.

The magnetometers 160 can be any suitable magnetometers including any suitable optical magnetometers (e.g., vector magnetometers), such as SERF zero-field vector magnetometers. The magnetic field generator(s) 162 can be, for example, Helmholtz coils, solenoid coils, planar coils, saddle coils, electromagnets, permanent magnets, or any other suitable arrangement for generating a magnetic field. The optional sensor(s) 164 can include, but are not limited to, one or more magnetic field sensors, position sensors, orientation sensors, accelerometers, image recorders, or the like or any combination thereof.

Figure 1B:
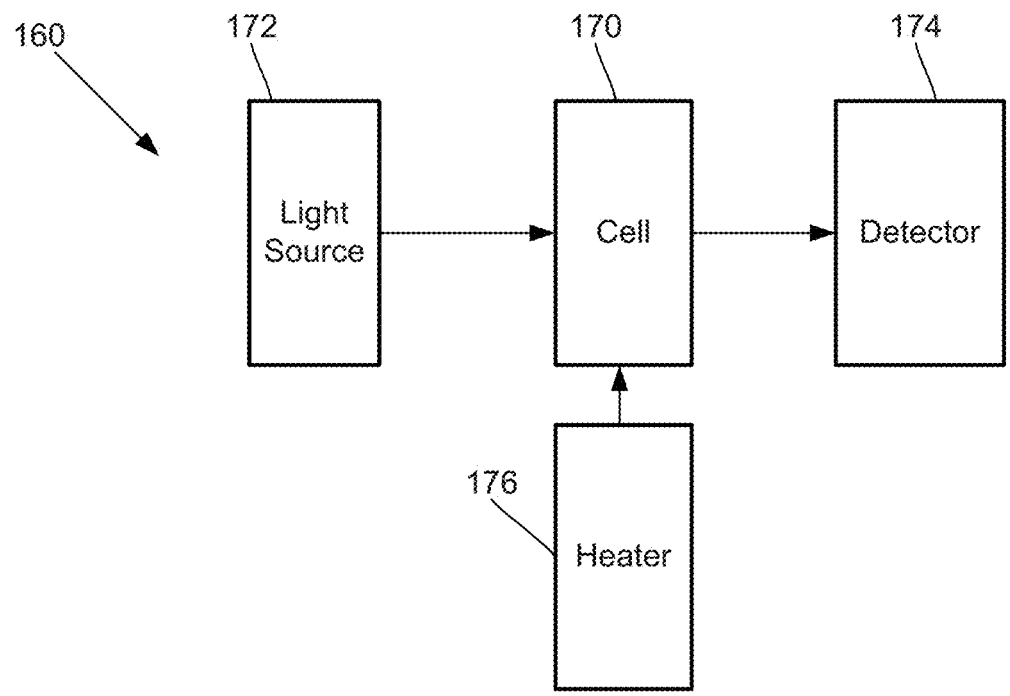
FIG. 1B is a schematic block diagram of one embodiment of a magnetometer, according to the invention.

An alkali metal vector magnetometer can be considered a zero-field magnetometer with the ability to operate in SERF mode with suppressed spin-exchange relaxation. At finite magnetic fields, such that the Larmor precession frequency is much higher than the intrinsic spin relaxation, the same device can be used to measure the absolute value of the field which can be a configuration known as scalar magnetometer. FIG. 1B is a schematic block diagram of one embodiment of a magnetometer 160 which includes a gas cell 170 (also referred to as a "cell") containing an alkali metal vapor or vaporizable material (for example, rubidium in natural abundance, isotopically enriched rubidium, potassium, or cesium, or any other suitable alkali metal such as lithium, sodium, potassium, rubidium, cesium, or francium), quenching gas (for example, nitrogen), and buffer gas (for example, nitrogen, helium, neon, or argon); a heater 176 to heat the cell 170; a light source 172, such as a laser to optically pump the alkali metal atoms and to probe the gas cell, as well as optics (such as lenses, waveplates, collimators, polarizers, and objects with reflective surfaces) for beam shaping and polarization control and for directing the light from the light source to the cell and detector; and a detector 174 (for example, an optical detector to measure the optical properties of the transmitted light field amplitude, phase, or polarization, as quantified through optical absorption and dispersion curves, spectrum, or polarization or the like or any combination thereof). In a scalar magnetometer, in addition to the above elements, a local oscillator (LO) can be added to drive the spin precession on resonance with the Larmor frequency as set by the ambient background magnetic field. The excitation can be introduced in the form of an RF field generated using the field generators or optically by modulating the intensity, frequency, or polarization of the pumping light beam.

In some embodiments, the heater 176 is arranged to heat the vapor or vaporizable material in the gas cell 170 to temperatures of at least 100° C. In at least some embodiments, the heater 176 is arranged to heat the vapor or vaporizable material in the gas cell 170 to temperatures of at least 200° C. In at least some embodiments, the heater 176 is arranged to heat the vapor or vaporizable material in the gas cell 170 to temperatures in the range 100° C. to 200° C. or higher. In at least some embodiments, the heater 176 is arranged to heat the vapor or vaporizable material in the gas cell 170 to temperatures in the range of 200° C. to 500° C. or higher.

Examples of suitable light sources include, but are not limited to, a diode laser (such as a vertical-cavity surface-emitting laser (VCSEL), distributed Bragg reflector laser (DBR), or distributed feedback laser (DFB)), light-emitting diode (LED), lamp, or any other suitable light source. Examples of suitable detectors include, but are not limited to, a photodiode, charge coupled device (CCD) array, camera, photodiode array, single photon avalanche diode (SPAD) array, avalanche photodiode (APD) array, or any other suitable optical sensor array that can measure the change in transmitted light at the optical wavelengths of interest.

Figure 2:
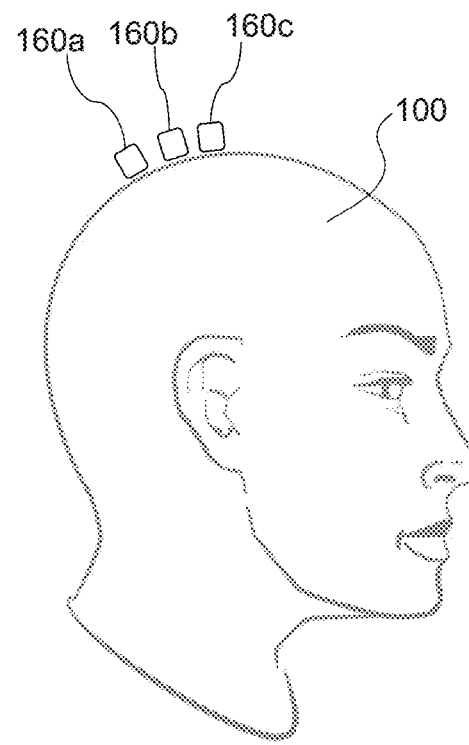
FIG. 2 is a schematic side view of one embodiment of an array of magnetometers for measuring magnetic fields generated in a brain of a user, according to the invention.
Figure 3:
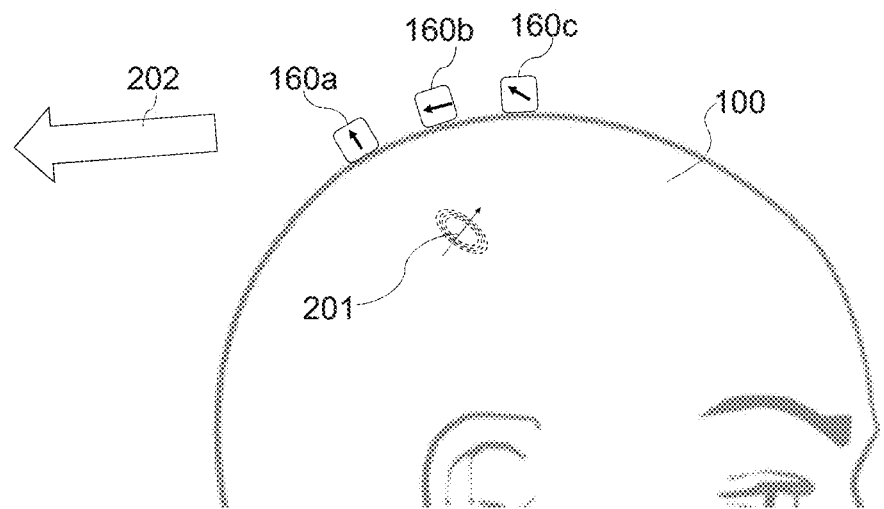
FIG. 3 is a schematic side view of one embodiment of the array of magnetometers of FIG. 2, a signal source in a brain of a user, and a direction of the ambient magnetic field, according to the invention.

FIG. 2 illustrates one embodiment of a system shown with several magnetometers, 160a, 160b, 160c placed on a user's head 100 to measure neural activity. FIG. 3 illustrates vector magnetic fields (e.g., signals) that might be generated by the neural activity 201 on each of the magnetometers. For each of the magnetometers 160a, 160b, 106c, the magnetic field vector could be different in both direction and amplitude. The ambient background magnetic field 202 (including, for example, the Earth's magnetic field) is about $10^8$ times larger than magnetic field from the neural activity and is not shown to scale. In at least some embodiments, before the small magnetic fields arising from neural activity can be measured at the magnetometers 160a, 160b, 160c the ambient background magnetic field 202 can be suppressed so that the resulting magnetic field is within the dynamic range of the SERF magnetometer (e.g., the range of the width of the zero-field magnetic resonance). For example, in some devices the dynamic range may be about 10 nT at cell temperatures of about 150° C. and is higher at more elevated temperatures.

Examples of magnetic field measurement systems or methods of making such systems or components for such systems are described in U.S. patent application Ser. Nos. 16/213,980 and 16/405,382 and U.S. Provisional Patent Application Ser. Nos. 62/689,696; 62/699,596; 62/719,471; 62/719,475; 62/719,928; 62/723,933; 62/732,327; 62/732,791; 62/741,777; 62/743,343; 62/747,924; 62/745,144; 62/752,067; 62/776,895; 62/781,418; 62/796,958; 62/798,209; 62/798,330; 62/804,539; 62/826,045; 62/827,390; 62/836,421; 62/837,574; 62/837,587; and 62/842,818, all of which are incorporated herein by reference.

In at least some embodiments, the OPM has an alkali metal vapor gas cell that contains alkali metal atoms in a combination of gas, liquid, and solid states (depending on temperature). Furthermore, the gas cell contains a quenching and buffer gas. In some embodiments the quenching gas and the buffer gas may be the same atomic species, for example nitrogen. The size of the gas cells can vary from a fraction of a millimeter up to several centimeters. Conventionally, the gas cell may be manufactured using a micro-electro-mechanical systems (MEMS) process or be constructed using traditional gas blowing methods, where the introduction of alkali metal gas into the cell is accomplished using traditional and manual processes. In the case of MEMS manufacturing, there are discrete optical and mechanical components of the system that guide light from an optical source to inside the gas cell, and subsequently guide light from the gas cell to a detector. Conventionally, these optics are discrete and separated from the gas cell itself.

In addition, to date most conventional SERF OPMs have been implemented with vapor cells made out of glass or quartz windows. Since alkali metal vapors react with these materials at elevated temperatures these conventional SERF OPMs have been limited to operating at temperatures below 200° C. and suffer from slow loss of alkali vapor, which could limit device life expectancy.

Materials, such as sapphire, that have advantages over conventional materials, such as durability or stability at higher temperatures, can be used for the gas cell or the single, integrated, unitary structure containing the gas cell. For example, gas cells with sapphire windows or walls or as the complete cell housing can be operated at higher temperatures (for example, up to 700° C. or more). Since sapphire is a birefringent material it can also be used to form optical retarders to, for instance, integrate a circular polarizer into a sapphire gas cell. The housing, windows, walls, or other portions of any of the gas cell embodiments described herein can be completely or partially formed of sapphire. Alternatively or additionally, conventional gas cell materials, such as glass, can be used for all or a portion of the gas cell housing, windows, walls, or the like. Coatings, such as aluminum oxide, may be used as either part of the manufacturing process or reduce loss of alkali.

Figure 4:
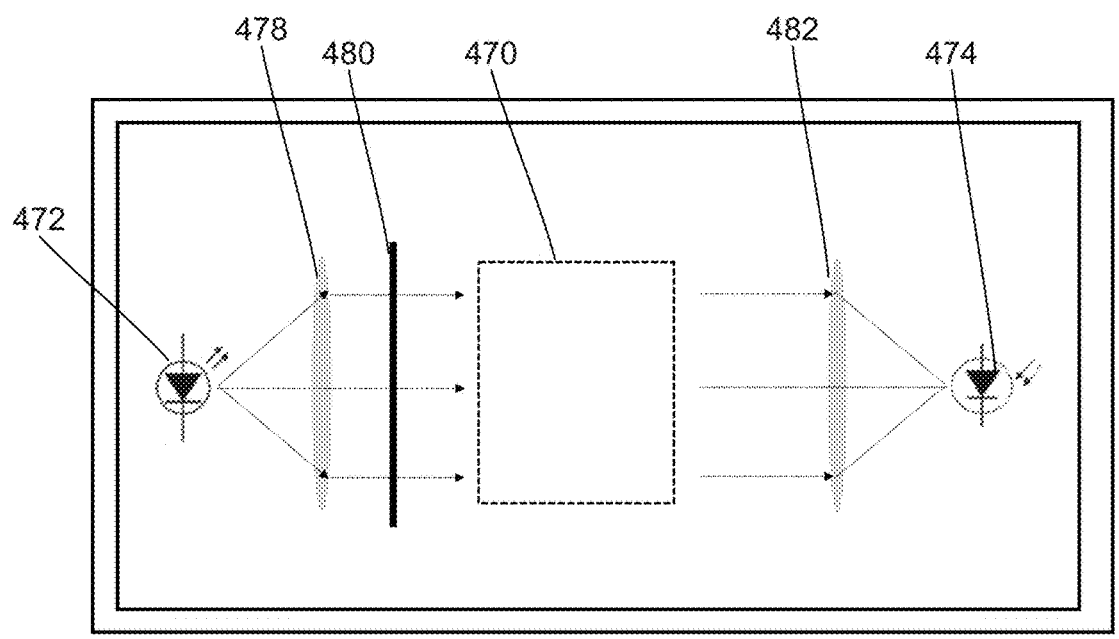
FIG. 4 is a schematic side view of one embodiment of a portion of a magnetometer, according to the invention.

FIG. 4 illustrates one example of an alkali metal gas cell, preferably made of sapphire, and discrete optical components used to create an optically pumped magnetometer (OPM). The light source 472 (for example, a distributed feedback laser (DFB), vertical cavity surface-emitting laser (VCSEL), or edge emitting laser diode) radiates light at its intrinsic beam divergence angle. A converging lens 478 can be used to collimate the light into a parallel path. The light is transformed from linearly to circularly polarized via a quarter wave plate 480. The light passes through the alkali metal vapor in the gas cell 470 and is rotated or absorbed by the alkali metal vapor before passing through a second converging lens 482 and is finally collected by the detector 474. In at least some embodiments, the windows or entire housing of the gas cell 470 can be made of sapphire so that the gas cell can operate at higher temperatures than conventional OPM gas cells.

Additionally or alternatively, in contrast to conventional arrangements, the gas cell can be integrated with optical components, such as one or more lenses, waveguides, vacuum layers or the like; can include novel material choices; or can include freeform optics to create a compact, manufacturable, and robust gas cell assembly. The gas cell can be integrated with optical components to form a single, integrated, unitary (or monolithic) structure. The term "unitary" is used to indicate that the components of the structure are joined together into a single unit (with or without additional listed components) that is solid except for the interior of the gas cell. For example, the gas cell can be integrated with one or more of the following: a collimating element configured for collimating light directed toward the gas cell from a light source, a quarter wave plate, or a lens configured for redirecting at least a portion of the light that passed through the gas cell toward one or more light detectors. Additional, fewer, or different optical components can also be used in the single, integrated, unitary structure that contains the gas cell. Such components may include, but are not limited to, collimating elements, lens elements, beam-shaping elements, polarizing elements, wave plates, beam splitters, prisms, reflective surfaces, filters, diffusers, gratings, or the like, or any combination thereof.

In at least some embodiments, manufacturing processes, such as the anodic bonding or non-anodic bonding of multiple layers, can be used. Furthermore, the bonding of these layers can be accomplished by introducing a layer of material between the substrates with a high density of hydroxyl groups (e.g. $Al_2O_3$). As another example of a manufacturing process, the transparent walls of a gas cell can be shaped to form an optical lens using, for example, direct polishing or thermal reflow techniques or any other suitable method.

Figure 5A:
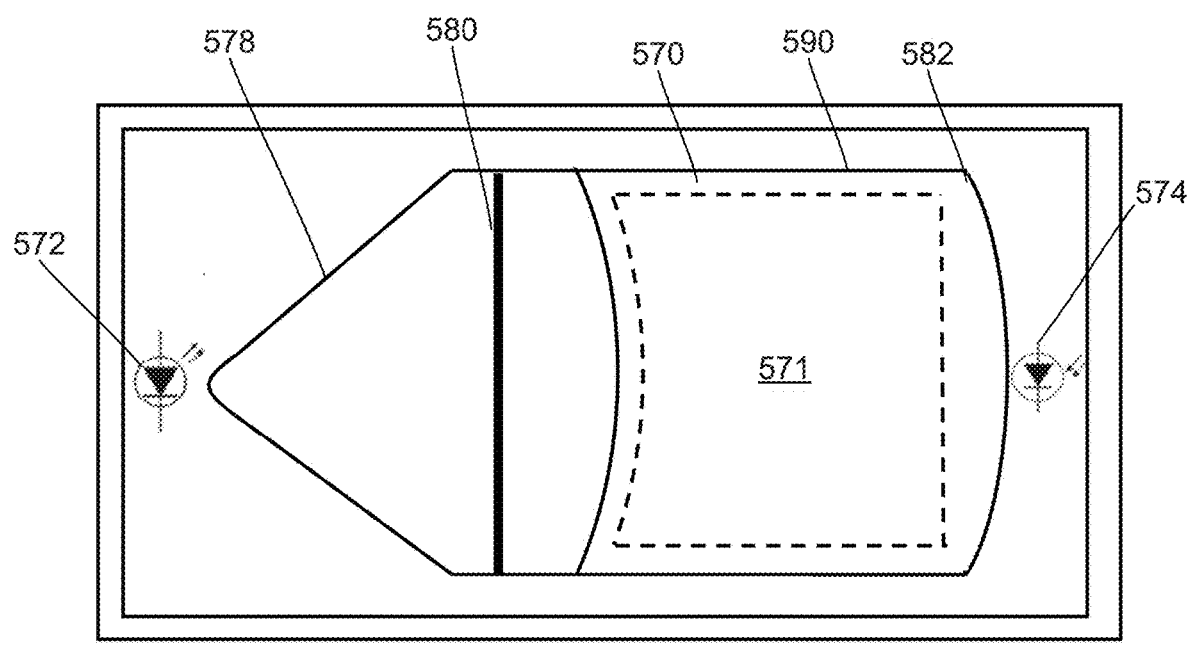
FIG. 5A is a schematic side view of another embodiment of a portion of a magnetometer, according to the invention.

FIG. 5A is an example of one embodiment of a gas cell 570 with optical components integrated together into a single, integrated, unitary (or monolithic) structure 590. The gas cell defines a cavity 571 that contains a vapor or vaporizable material, for example, an alkali metal such as lithium, sodium, potassium, rubidium, cerium, or francium. The cavity may also include a buffer gas, quenching gas, or any other suitable material for operation of the magnetometer, or any combination thereof.

The structure 590 can include one or more optical components for laser beam shaping, collimation, and collection that are integrated with the gas cell 570 to form the single, integrated, unitary structure 590. In the embodiment of FIG. 5A, structure 590 includes an integrated collimating element 578 (or other beam-shaping element) with a high conic-constant surface which can collimate the light, an integrated quarter wave plate 580, a gas cell 570, and an integrated aspheric lens element 582. The collimating element 578 and lens element 582 can take shapes other than those illustrated in FIG. 5A. The quarter wave plate 580 may be a component formed in the material (e.g., sapphire or glass) that forms the collimating element 578 and gas cell 570 or may be an individual component directly attached between the collimating element 578 and the gas cell 570.

Light leaving the alkali metal gas cell 570 passes through the shaped cell wall (i.e., lens element 582) which concentrates or redirects the light to the electro-optical detector 574. In FIG. 5A, all the elements between the light source 572 and the detector 574 are a single, integrated, unitary (or monolithic) structure 590 that contains the alkali metal gas cell 570. This structure 590 (other than the contents in the cavity 571) may include multiple materials that are bonded together, but in at least some embodiments the structure 590 is formed of a single material, such as sapphire or glass or any other suitable material.

Figure 5B:
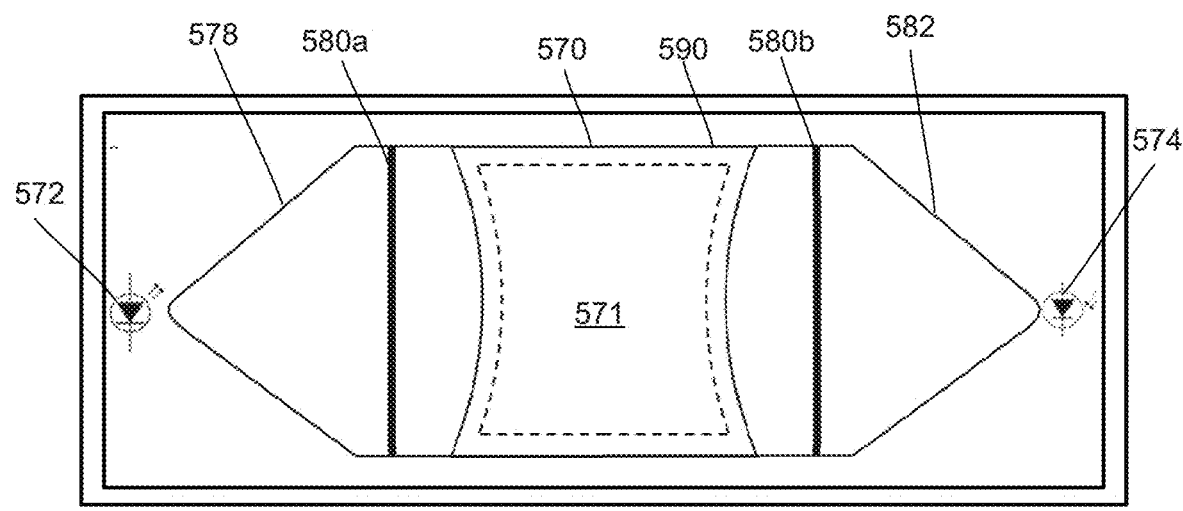
FIG. 5B is a schematic side view of a third embodiment of a portion of a magnetometer, according to the invention.

FIG. 5B is another example of an embodiment of a gas cell 570 with optical components, including a collimating element 578, two quarter wave plates 580a, 580b, and a lens element 582, integrated together into a single, integrated, unitary (or monolithic) structure 590. Similar to the embodiment illustrated in FIG. 5A, the structure 590 of FIG. 5B includes integrated lens components for laser beam shaping, collimation, and collection. However, the structure 590 in FIG. 5B has a symmetric arrangement of elements.

Figure 5C:
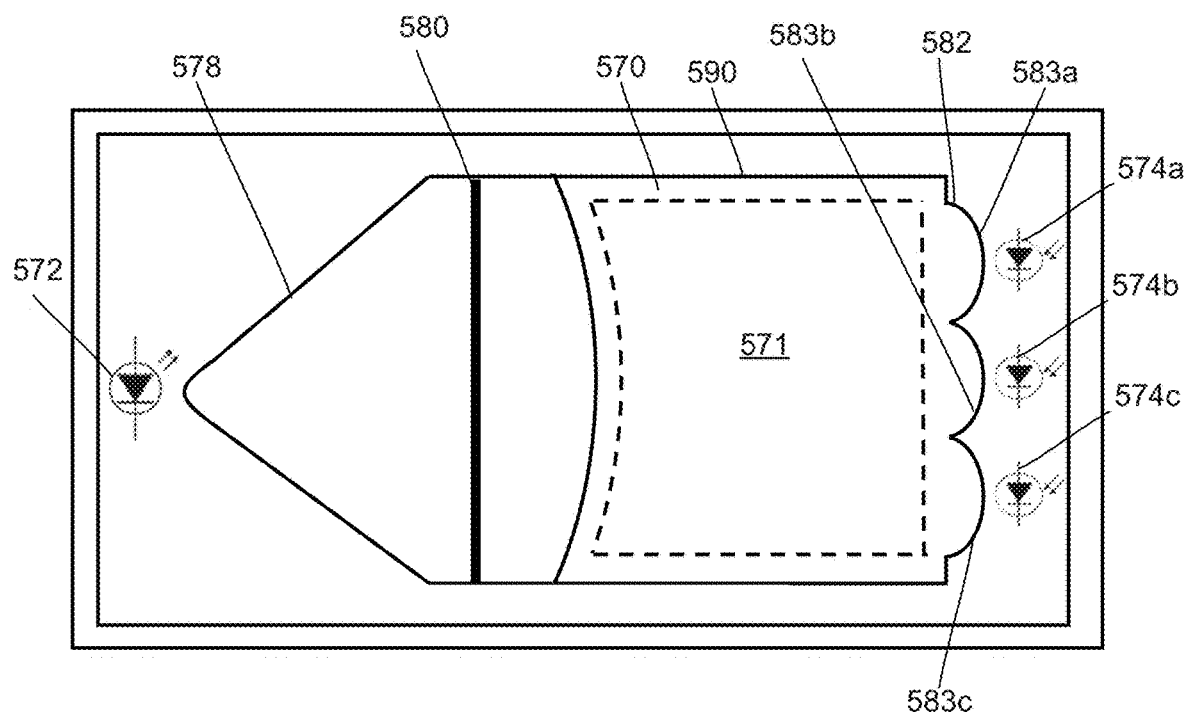
FIG. 5C is a schematic side view of a fourth embodiment of a portion of a magnetometer, according to the invention.

FIG. 5C illustrates another embodiment with a gas cell 570, collimating element 578, quarter wave plate 580, and lens element 582; however, instead of a single detector, an array of optical detectors 574a, 574b, 574c is used and is intended to observe light passing through different regions of the gas cell. Examples of arrays of optical detectors include, but are not limited to, cameras or arrays of elements such as, photodiodes, charge-coupled devices (CCD), avalanche photodiodes (APD), photodiodes, or the like, or any combination thereof. The lens element 582 may include an array of concentrators 583a, 583b, 583c or other formations than can be used to redirect or focus light from different regions of the gas cell 570 to the individual detectors 574a, 574b, 574c. In at least some embodiments, the concentrators 583a, 583b, 583c translate an intrinsic optical voxel size to a detector pixel size. The optical voxels may be determined by the properties of the atomic physics of the gas cell 570 and the active area of the optical detectors 574a, 574b, 574c. In some other embodiments, the array of concentrators 583a, 583b, 583c is not included, and this area or section of the cell is flat (not shown) or convexly curved as illustrated in FIG. 5A.

Figure 5D:
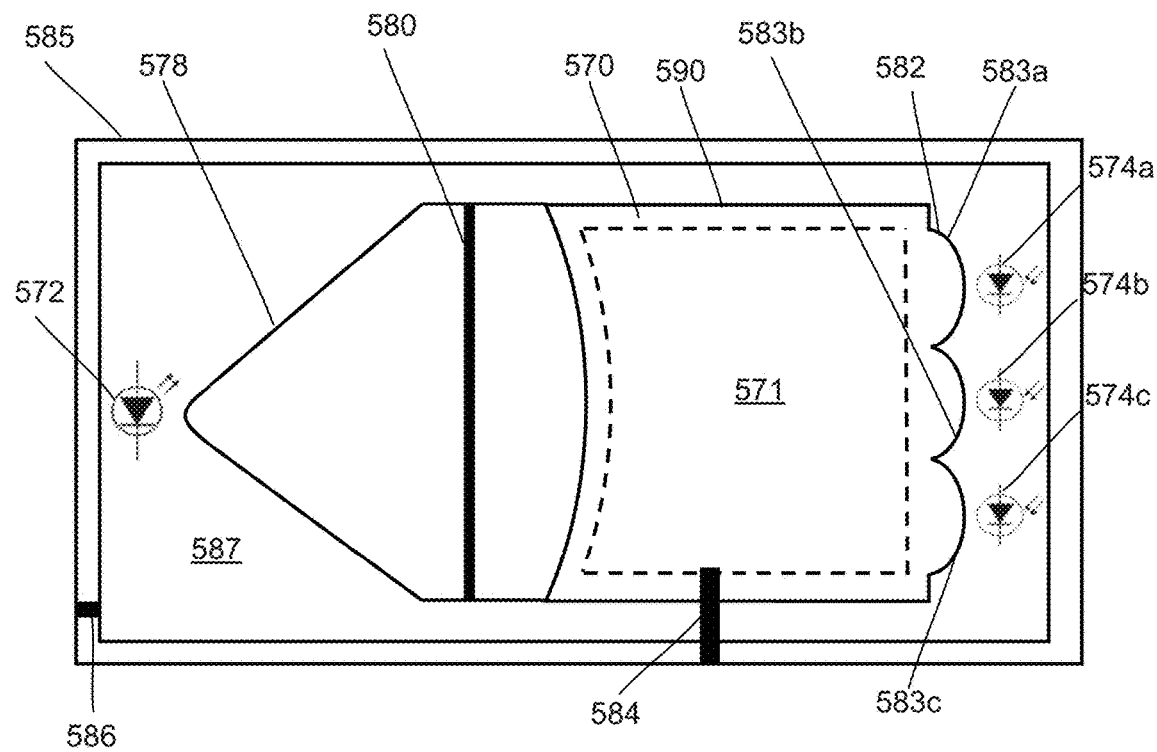
FIG. 5D is a schematic side view of a fifth embodiment of a portion of a magnetometer, according to the invention.
Figure 5E:
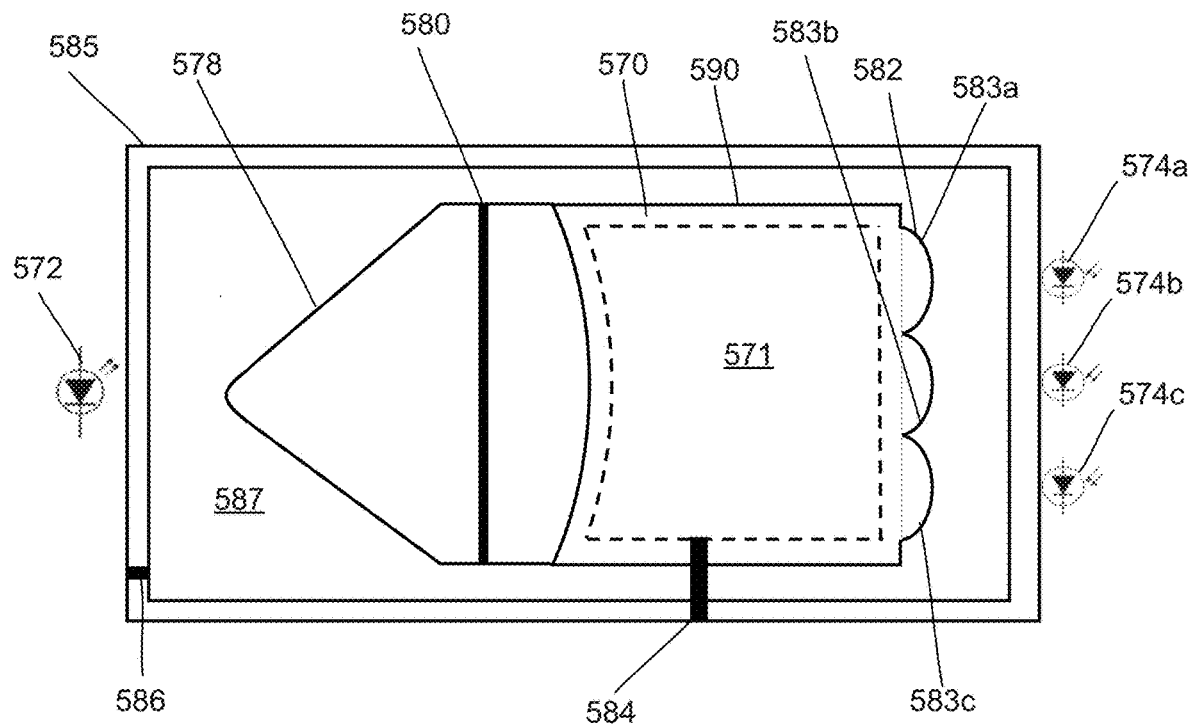
FIG. 5E is a schematic side view of a sixth embodiment of a portion of a magnetometer, according to the invention.

FIGS. 5D and 5E illustrate the use of microfluidic channels 584, 586 into the wall of the gas cell 570, as well as into the wall of a surrounding assembly chamber 585, which can be part of the same or another integration manufacturing process. Microfluidic channels can provide advantages for both the introduction of alkali metal gas into the gas cell, as well as enabling methods for establishing gaseous boundaries of the gas cell. In addition, a vacuum layer can be introduced between the gas cell 570 and the assembly chamber 585, which may enhance thermal conductivity and reduce the power used for heating.

FIG. 5D illustrates an embodiment that is similar to the embodiment illustrated in FIG. 5C, but with a microfluidic channel 584 introduced into the wall of the assembly chamber 585 and a microfluidic channel 586 introduced into the wall of the gas cell 570. The channels 584, 586 can be used to introduce buffer gas, such as neon, argon, or the like, or alkali metal vapor, such as lithium, sodium, potassium, rubidium, or cesium, or a quenching gas, such as nitrogen or the like, into the gas cell 570. The channel 584 in the assembly chamber may also be used to evacuate gas from the region 587 within the assembly chamber 585. The channels 584, 586 can be small in width or diameter to reduce the amount of material used to backfill the channels in order to close the channels.

A vacuum in region 587 may thermally insulate the heated gas cell 570 from the surrounding environment outside the assembly chamber walls and, thereby, reduce the amount of power used to heat the gas cell 570. In FIG. 5D, the light source 572 and detector 574 are disposed within the assembly chamber 585. In FIG. 5E, the light source 572 and detector 574 are disposed outside of the assembly chamber 585 which is made of a material that transmits at least a portion of the light generated by the light source.

It will be understood that the structures 590 illustrated in FIGS. 5A to 5E may also include other optical components than those illustrated. It will also be understood that the arrangements in FIGS. 5A to 5E can be modified so that one or more of the optical components in the structures 590 are removed from that structure 590 and positioned as discrete optical components that are separated from the modified structure 590.

Cell heating may be achieved through any suitable arrangement or mechanism. For example, in at least some embodiments, the heater 176 (FIG. 1B) can be an optical light heater (for example, a laser) that emits light which is absorbed by an optical absorber disposed on the cell surface. In at least some embodiments, the optical absorber is tuned to the wavelength of the optical light heater and allows the light from the light source 172 (FIG. 1B) to pass through without loss. In other embodiments, the heater 176 (FIG. 1B) can provide electrical heating using a conductive layer patterned to limit magnetic field generation using optically transparent materials such as transparent conductive material (TCM) or transparent conductive oxides (TCO), such as indium tin oxide (ITO). In yet other embodiments, the heater 176 (FIG. 1B) can be a chip resistor that is placed in close contact to the cell to transfer heat by passing DC/AC electrical currents.

Figure 6:
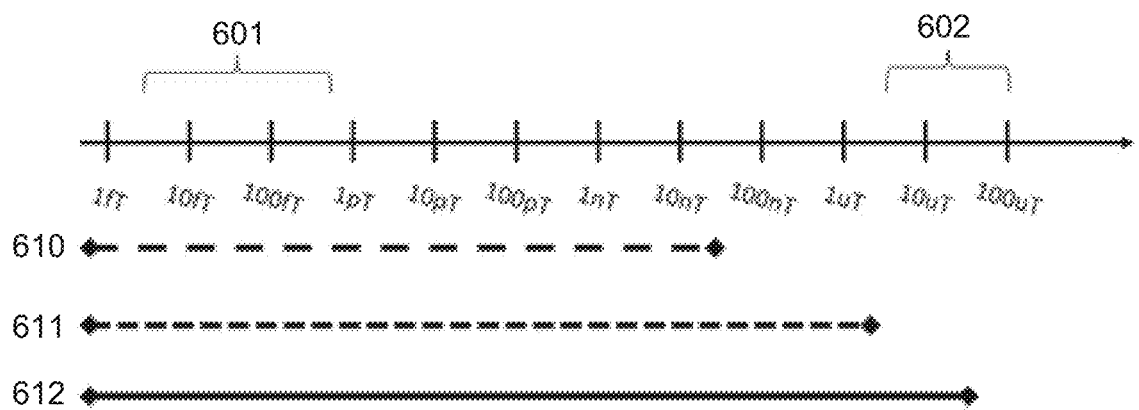
FIG. 6 shows a magnetic spectrum with lines indicating dynamic ranges of magnetometers with different alkali metal vapor densities.

FIG. 6 shows a log-scale representation of the magnetic spectrum. The Earth's magnetic field 602 is about 7 to 8 orders of magnitude larger than the strength of the magnetic field generated by neural signals 601 and well outside the regime of conventional SERF systems that operate below 200° C. Using high temperature materials, such as sapphire, to form the gas cell, it is possible to operate the gas cell at elevated temperatures, thus extending the dynamic range of SERF up to include the Earth's magnetic field. The dynamic range of SERF OPMs implemented at $1 \times 10^{14}$, $1 \times 10^{16}$ and $1 \times 10^{17}$ alkali metal atoms per $cm^3$ is indicated by lines 610, 611 and 612, respectively. These roughly translate gas cells heated to 150° C., 300° C., and 400° C. At 400° C. the dynamic range reaches the Earth's magnetic field.

Figure 7:
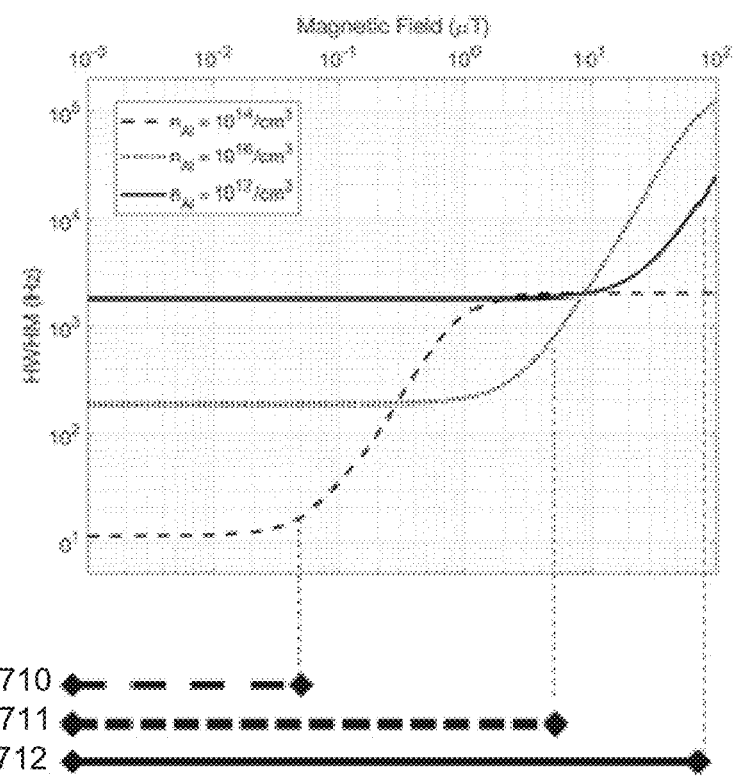
FIG. 7 shows a graph of magnetic field versus the half width/half max magnetic field line for SERF OPMs with different alkali metal vapor densities.

As illustrated in FIG. 7, the SERF regime is defined as the narrowing of the magnetic line occurring when the spin-exchange collision rate is much faster than the Larmor precession angular frequency. Within this regime spin-exchange broadening is suppressed and high sensitivity achieved. As conventional OPMs are implemented using materials that cannot withstand elevated temperatures (for example, above 200° C.), conventional SERF devices have a limited dynamic range on the order of a few tens of nano-Tesla (shown by line 710). This requires conventional SERF devices to operate at low magnetic fields, typically found inside magnetically shielded rooms. In contrast, in at least some embodiments, SERF OPMs implemented with sapphire, as described herein, can operate at temperatures as elevated as 500° C. or more. As a result, their density is much higher and may operate in the SERF regime at Earth's magnetic field so that, in some embodiments, shielding may be optional.

The dynamic range for SERF OPMs implemented at $1 \times 10^{14}$, $1 \times 10^{16}$ and $1 \times 10^{17}$ alkali metal atoms per $cm^3$ is indicated by lines 710, 711 and 712. These roughly translate to 150° C., 300° C. and 400° C. For each dynamic range a further increase of magnetic field strength causes the turning-on of spin-exchange broadening. Both FIG. 7 and FIG. 8, were generated using Rb-87 as the alkali metal species, 1 atm of neon buffer-gas and 50 Torr of $N_2$ quenching gas. The contribution of alkali metal collisions with buffer gas atoms, quenching gas molecules, and cell walls account for about 60 $s^{-1}$ relaxation rate. In computing spin relaxation due to alkali metal-alkali metal collisions a SE cross-section of $2 \times 10^{-14}$ $cm^2$ and a spin-destruction cross-section of $9.8 \times 10^{18}$ $cm^2$ were used. The relative speed of two colliding atoms is assumed to be $5 \times 10^4$ cm/sec at all densities. A slowing down-factor q=4 was assumed. These arrangements can also apply to other alkali metal atoms and gas mixtures.

Figure 8:
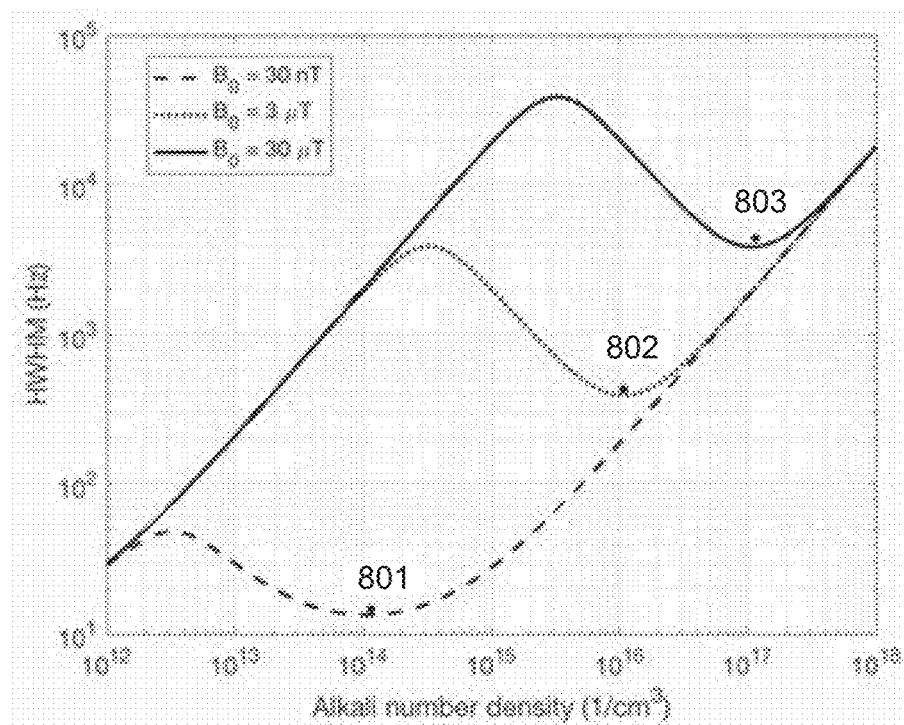
FIG. 8 shows a graph of alkali metal number density versus the half width/half max magnetic field line for SERF OPMs for different magnetic fields.

FIG. 8 shows the effect of increasing alkali metal density in the presence of a specific magnetic field strength. Three example magnetic field strengths are used, 30 nT, 3.0 T and 30 T. The minimum alkali metal density to achieve SERF at each magnetic field strength are indicated by 801, 802 and 803, respectively. At low magnetic fields, increasing the density introduces spin-exchange (SE) relaxation which is proportional to the spin-exchange collision rate Rse. As the density is further increased SE broadening is partially suppressed. When 10 Rse~Larmor rate, the SE broadening is completely suppressed thus enabling narrow magnetic lines and high-sensitivity OPMs.

The single, integrated unitary structures and vapor cells described above can serve as a central element in OPM systems, enabling, at least in some embodiments, the OPMs and systems (such as magnetic field measurement systems) to be miniaturized, scaled, or manufactured in a more cost-effective manner. As such, the devices, arrangements, and systems described herein can have applications in various fields, including, but not limited to, atomic clocks, military applications (e.g. land-mine detection), geological applications (e.g. sample magnetization measurements), fundamental physics experiments, and biological imaging applications (e.g. magnetoencephalography (MEG), magnetocardiography (MCG), magnetogastography, magnetomyography).

In at least some embodiments, when implemented with sapphire, OPMs can operate at much higher temperatures than conventional SERF devices, for example, 200° C. to 500° C. or higher, and can have a higher alkali metal vapor pressure and thus a higher spin-exchange collision rate. As a result, in at least some embodiments, such SERF OPMs can operate at higher background magnetic fields than conventional devices. At least in some embodiments, such SERF OPMs may not utilize or require magnetic shielding.

This disclosure describes embodiments that include one or more of the following: the monolithic and quasi-monolithic integration of gas cells and optical components, and the use of microfluidic channels. In at least some embodiments, one or more discrete optical components can be used instead. Examples of these optical components include lenses, polarizers, waveplates, waveguides, fiber-optics, beam splitters, modulators, and freeform optics. The architecture of optical components depends on the type of OPM being implemented and the target performance characteristics. Because the optical components are discrete and separate, however, these systems may be inherently immobile, bulky, fragile, and difficult to manufacture as compared to gas cells with integrated optical components.

Figure 9:
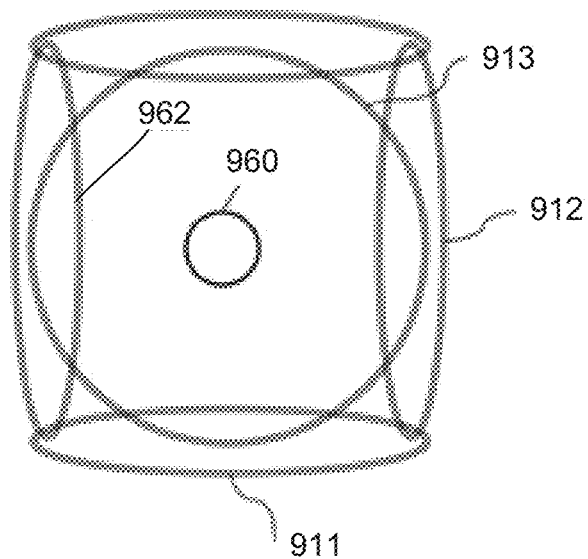
FIG. 9 is a schematic side view of one embodiment of a magnetometer and a magnetic field generator, according to the invention

FIG. 9 illustrates one embodiment of an arrangement of a magnetometer 960 and a magnetic field generator 962. For magnetic field sensing, the magnetometer 960, which can incorporate any of the arrangements illustrated in FIGS. 5A to 5E or any other suitable arrangement of components, is placed within (or near) a magnetic field generator 962 that generate magnetic fields at the position of the magnetometer (or an array of magnetometers). An example of magnetic field generator 962 is a tri-axis set of coil pairs which generate a magnetic field when electrical current is passed through conductors such as copper wires. In at least some embodiments, in each coil pair, two magnetic loops of diameter D are separated by distance D to generate a uniform magnetic field along the center line that connects the two constituent coils. To generate a 3-dimensional magnetic vector of arbitrary choosing, three sets of coil pairs are used. The top/bottom coil pair 911 generates the vertical component of the magnetic field, the left/right coil pair 912 generates the left-right component of the magnetic field, and the front/back coil pair 913 generates the front-back component of the magnetic field.

The above specification provides a description of the invention and its manufacture and use. Since many embodiments of the invention can be made without departing from the spirit and scope of the invention, the invention also resides in the claims hereinafter appended.

What is claimed as new and desired to be protected by Letters Patent of the United States is:

1. An optically pumped magnetometer, comprising:
    a single, integrated, unitary structure, comprising
        a gas cell defining a cavity having a vapor or vaporizable material disposed therein,
        a collimating element coupled to the gas cell and configured for collimating light directed toward the gas cell, wherein the collimating element is a converging lens or has a high conic-constant surface,
        a quarter wave plate between the collimating element and the gas cell, and
        a lens element coupled to the gas cell and configured for redirecting at least a portion of light that has passed through the gas cell, wherein the lens element is a converging lens, an aspheric lens, or an array of concentrators configured to redirect light that has passed through different regions of the gas cell to different points for detection.

2. The magnetometer of claim 1, wherein the lens element is formed in a wall of the gas cell.

3. The magnetometer of claim 1, wherein the quarter wave plate and collimating optical element are formed in a wall of the gas cell.

4. The magnetometer of claim 1, further comprising a light source configured and arranged for illuminating the gas cell through the collimating element.

5. The magnetometer of claim 1, further comprising a light detector configured and arranged for receiving light passing through the gas cell and the lens element.

6. The magnetometer of claim 1, further comprising an assembly chamber within which the single, integrated, unitary structure is disposed.

7. The magnetometer of claim 6, further comprising a microfluidic channel through the assembly chamber and into the gas cell.

8. The magnetometer of claim 6, further comprising a microfluidic channel into the assembly chamber.

9. The magnetometer of claim 1, wherein the single, integrated, unitary structure is formed of sapphire.

10. A magnetic field measurement system, comprising:
    the magnetometer of claim 1;
    a light source configured and arranged to direct light through the gas cell;
    a detector configured and arranged to receive light from the light source that passes through the gas cell.

11. The magnetic field measurement system of claim 10, further comprising a magnetic field generator configured to generate a magnetic field at the magnetometer.

12. The magnetometer of claim 1, wherein the lens element is the aspheric lens.

13. The magnetometer of claim 1, wherein the lens element is the array of concentrators.

14. The magnetometer of claim 1, wherein the collimating element has the high conic-constant surface.

15. An optically pumped magnetometer, comprising:
    a single, integrated, unitary structure, comprising
        a gas cell defining a cavity having a vapor or vaporizable material disposed therein, wherein walls of the gas cell are formed of sapphire,
        a collimating element coupled to the gas cell and configured for collimating light directed toward the gas cell, wherein the collimating element is a converging lens or has a high conic-constant surface, and a lens element coupled to the gas cell and configured for redirecting at least a portion of light that has passed through the gas cell, wherein the lens element is a converging lens, an aspheric lens, or an array of concentrators configured to redirect light that has passed through different regions of the gas cell to different points for detection.

16. A magnetic field measurement system, comprising:

the magnetometer of claim 15;

a light source configured and arranged to direct light through the gas cell;

a detector configured and arranged to receive light from the light source that passes through the gas cell.

17. A magnetometer, comprising:

a gas cell made of sapphire and defining a chamber having a vapor or vaporizable material disposed therein;

a lens element forming a monolithic structure with the gas cell and configured for redirecting at least a portion of light that has passed through the gas cell, wherein the lens element is a converging lens, an aspheric lens, or an array of concentrators configured to redirect light that has passed through different regions of the gas cell to different points for detection;

a heater coupled to the gas cell and configured to heat the vapor or vaporizable material to at least 100° C.; and a magnetic field generator configured to generate a magnetic field at the gas cell.

18. The magnetometer of claim 17, further comprising a light source configured and arranged to direct light through the gas cell; and a detector configured and arranged to receive light from the light source that passes through the gas cell.

19. The magnetometer of claim 17, wherein the gas cell further comprises a wave plate formed in a wall of the gas cell.

20. The magnetometer of claim 17, wherein the gas cell further comprises a collimating element coupled to the gas cell and configured for collimating light directed toward the gas cell.

* * * * *